(12) United States Patent
Jeong et al.

(10) Patent No.: US 12,177,546 B2
(45) Date of Patent: Dec. 24, 2024

(54) CAMERA MODULE AND ELECTRONIC DEVICE INCLUDING THE SAME

(71) Applicant: SAMSUNG ELECTRONICS CO., LTD., Suwon-si (KR)

(72) Inventors: Wonjun Jeong, Suwon-si (KR); Jihyung Lee, Suwon-si (KR); Minki Cho, Suwon-si (KR); Kihuk Lee, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/983,394

(22) Filed: Nov. 9, 2022

(65) Prior Publication Data

US 2023/0146983 A1 May 11, 2023

Related U.S. Application Data

(63) Continuation of application No. PCT/KR2022/016444, filed on Oct. 26, 2022.

(30) Foreign Application Priority Data

Nov. 10, 2021 (KR) .................. 10-2021-0154099

(51) Int. Cl.
*H04N 23/54* (2023.01)
*G02B 7/02* (2021.01)
(Continued)

(52) U.S. Cl.
CPC ............. *H04N 23/54* (2023.01); *G02B 7/021* (2013.01); *G03B 30/00* (2021.01); *H04N 23/51* (2023.01)

(58) Field of Classification Search
CPC ........ H04N 23/54; H04N 23/51; H04N 23/55; H04N 23/57; G02B 7/021; G03B 30/00
See application file for complete search history.

(56) References Cited

U.S. PATENT DOCUMENTS

| 7,664,390 B2 | 2/2010 | Cho et al. |
| 10,194,066 B2 | 1/2019 | Jung et al. |
| 10,270,948 B2 | 4/2019 | Lee et al. |

(Continued)

FOREIGN PATENT DOCUMENTS

| JP | 6-342966 A | 12/1994 |
| JP | 8-237554 A | 9/1996 |

(Continued)

OTHER PUBLICATIONS

International Search Report mailed Feb. 16, 2023 for PCT/KR2022/016444, citing the above reference(s).

(Continued)

*Primary Examiner* — Mekonnen D Dagnew
(74) *Attorney, Agent, or Firm* — CANTOR COLBURN LLP

(57) ABSTRACT

An electronic device includes a housing and a camera module in the housing. The camera module includes a camera housing, a lens assembly disposed in the camera housing, an image sensor disposed in the camera housing and at least partially aligned with an optical axis of the lens, a metal plate including a first area that overlaps the image sensor when viewed in a direction of the optical axis and a second area around the first area, and a circuit board at least partially attached to the metal plate and electrically connected with the image sensor. A slit that penetrates the metal plate or a recess concavely defined in a surface of the metal plate is defined in the second area of the metal plate.

19 Claims, 23 Drawing Sheets

(51) Int. Cl.
*G03B 30/00* (2021.01)
*H04N 23/51* (2023.01)

(56) References Cited

U.S. PATENT DOCUMENTS

| | | | |
|---|---|---|---|
| 10,771,667 | B2 | 9/2020 | Jung et al. |
| 11,418,687 | B2 | 8/2022 | Kim et al. |
| 2007/0217786 | A1 | 9/2007 | Cho et al. |
| 2011/0262121 | A1 | 10/2011 | Yanagisawa et al. |
| 2016/0065801 | A1* | 3/2016 | Bae .................. H04N 23/57 348/376 |
| 2016/0241763 | A1 | 8/2016 | Jung et al. |
| 2017/0295304 | A1* | 10/2017 | Hu .................. H05K 1/181 |
| 2019/0068846 | A1 | 2/2019 | Jung et al. |
| 2019/0149707 | A1 | 5/2019 | Jung et al. |
| 2021/0251083 | A1 | 8/2021 | Jung et al. |
| 2022/0353396 | A1 | 11/2022 | Kim et al. |

FOREIGN PATENT DOCUMENTS

| | | |
|---|---|---|
| JP | 2008-306350 A | 12/2008 |
| KR | 10-2007-0093768 A | 9/2007 |
| KR | 10-2016-0100025 A | 8/2016 |
| KR | 10-2017-0116461 A | 10/2017 |
| KR | 10-2019-0019729 A | 2/2019 |
| KR | 10-2019-0083538 A | 7/2019 |
| KR | 10-2019-0110226 A | 9/2019 |
| KR | 20210084148 A | 7/2021 |
| WO | 2018131189 A1 | 7/2018 |

OTHER PUBLICATIONS

The extended European search report for EP Application No. 22893073.1 mailed on Oct. 31, 2024.

* cited by examiner

CAMERA MODULE AND ELECTRONIC DEVICE INCLUDING THE SAME

CROSS-REFERENCE TO RELATED APPLICATIONS

This application is a continuation of International Application No. PCT/KR2022/016444 designating the United States, filed on Oct. 26, 2022, and claiming priority to Korean Patent Application No. 10-2021-0154099, filed on Nov. 10, 2021, in the Korean Intellectual Property Office, the disclosures of which are incorporated by reference herein in their entireties.

TECHNICAL FIELD

Embodiments of the disclosure described herein relate to a camera module and an electronic device including the same.

BACKGROUND ART

A recent mobile electronic device is desired to be equipped with a high-specification camera module. The high-specification camera module may include a large-sized lens and a large-sized image sensor, and an overall size of the camera module may be increased. A thickness of the camera module may be closely related to a thickness of the mobile electronic device. A recent mobile electronic device equipped with the high-specification camera module may include a camera area protruding from a rear surface thereof.

DISCLOSURE

Technical Problem

Embodiments of the disclosure provide a camera module including an image sensor mounting structure for reducing or preventing cracks in an image sensor that are likely to occur in an assembly process.

Technical Solution

An electronic device in an embodiment of the disclosure includes a housing and a camera module in the housing. The camera module includes a camera housing, a lens assembly disposed in the camera housing, an image sensor disposed in the camera housing and at least partially aligned with an optical axis of the lens, a metal plate including a first area that overlaps the image sensor when viewed in a direction of the optical axis and a second area around the first area, and a circuit board at least partially attached to the metal plate and electrically connected with the image sensor. A slit that penetrates the metal plate or a recess concavely defined in a surface of the metal plate is defined in the second area of the metal plate.

Advantageous Effects

The camera module in the embodiments of the disclosure may reduce bending stress applied to the image sensor during assembly or use.

Furthermore, the camera module in the embodiments of the disclosure may include the metal plate having a relatively small thickness, and thus the camera module and the electronic device may have a relatively small thickness.

In addition, the disclosure may provide various effects that are directly or indirectly recognized.

DESCRIPTION OF DRAWINGS

With regard to description of the drawings, identical or similar reference numerals may be used to refer to identical or similar components.

MODE FOR INVENTION

Hereinafter, various embodiments of the disclosure may be described with reference to accompanying drawings. Accordingly, those of ordinary skill in the art will recognize that modification, equivalent, and/or alternative on the various embodiments described herein can be variously made without departing from the scope and spirit of the disclosure.

Figure 1:
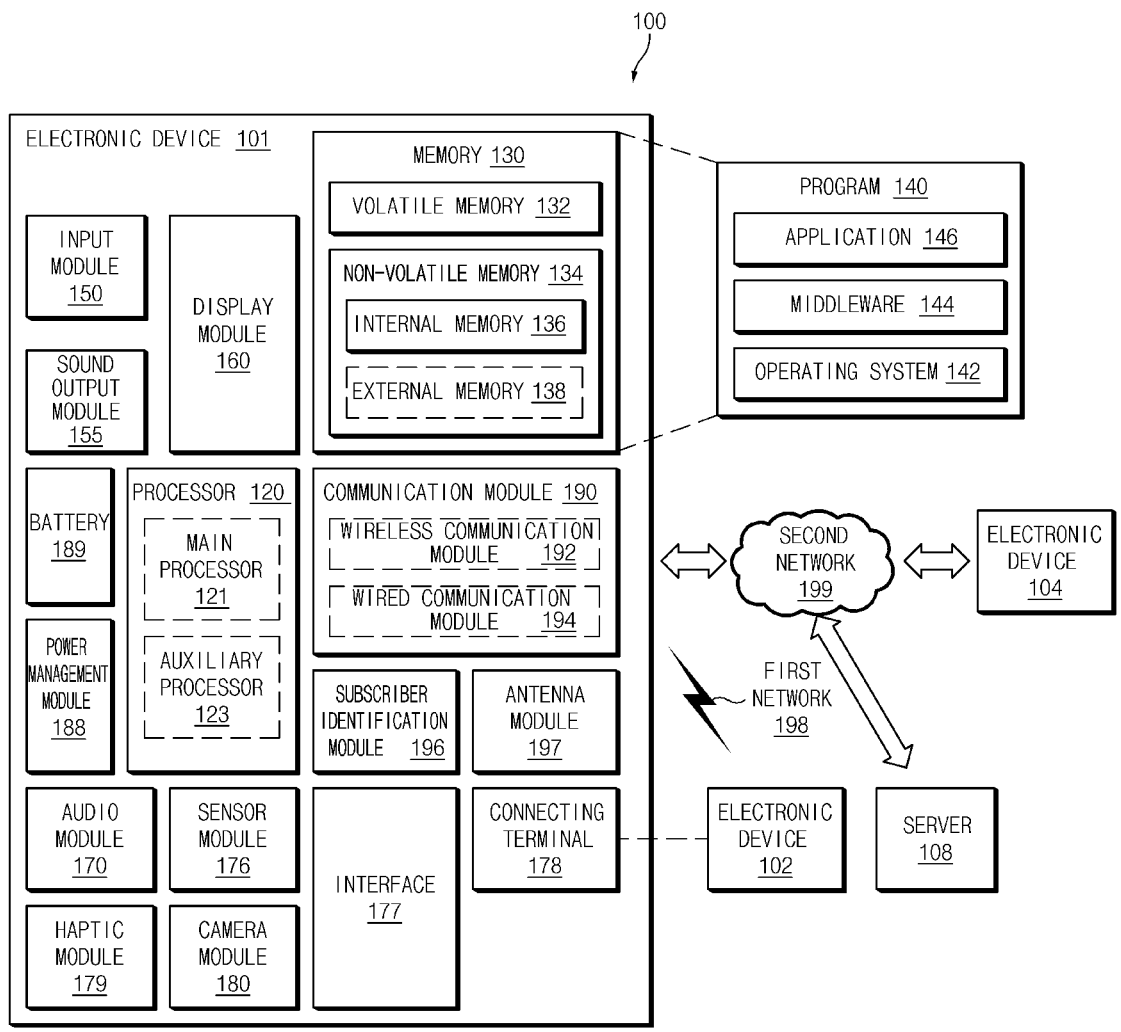
FIG. 1 is a block diagram of an embodiment of an electronic device in a network environment.

FIG. 1 is a block diagram illustrating an embodiment of an electronic device in a network environment.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). In an embodiment, the electronic device 101 may communicate with the electronic device 104 via the server 108. In an embodiment, the electronic device 101 may include a processor 120, a memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module ("SIM") 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute software (e.g., a program 140) to control at least one other component (e.g., a hardware or software component) of the electronic device 101 coupled with the processor 120, and may perform various data processing or computation, for example. In an embodiment, as at least a part of the data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. In an embodiment, the processor 120 may include a main processor 121 (e.g., a central processing unit ("CPU") or an application processor ("AP")), or an auxiliary processor 123 (e.g., a graphics processing unit ("GPU"), a neural processing unit ("NPU"), an image signal processor ("ISP"), a sensor hub processor, or a communication processor ("CP")) that is operable independently from, or in conjunction with, the main processor 121. In an embodiment, when the electronic device 101 includes the main processor 121 and the auxiliary processor 123, the auxiliary processor 123 may be adapted to consume less power than the main processor 121, or to be specific to a specified function, for example. The auxiliary processor 123 may be implemented as separate from, or as a part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). In an embodiment, the auxiliary processor 123 (e.g., an image signal processor or a communication processor) may be implemented as a part of another component (e.g., the camera module 180 or the communication module 190) functionally related to the auxiliary processor 123. In an embodiment, the auxiliary processor 123 (e.g., the neural processing unit) may include a hardware structure specified for artificial intelligence model processing. An artificial intelligence model may be generated by machine learning. Such machine learning may be performed, e.g., by the electronic device 101 where the artificial intelligence is performed or via a separate server (e.g., the server 108). Machine learning algorithms may include, but are not limited to, e.g., supervised machine learning, unsupervised machine learning, semi-supervised machine learning, or reinforcement machine learning. The artificial intelligence model may include a plurality of artificial neural network layers. The artificial neural network may be a deep neural network ("DNN"), a convolutional neural network ("CNN"), a recurrent neural network ("RNN"), a restricted Boltzmann machine ("RBM"), a deep belief network ("DBN"), a bidirectional recurrent deep neural network ("BRDNN"), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include software (e.g., the program 140) and input data or output data for a command related thereto, for example. The memory 130 may include the volatile memory 132 or the non-volatile memory 134.

The program 140 may be stored in the memory 130 as software, and may include an operating system ("OS") 142, middleware 144, or an application 146, for example.

The input module 150 may receive a command or data to be used by another component (e.g., the processor 120) of the electronic device 101, from the outside (e.g., a user) of the electronic device 101. The input module 150 may include a microphone, a mouse, a keyboard, a key (e.g., a button), or a digital instrument such as a digital pen (e.g., a stylus pen), for example.

The sound output module 155 may output sound signals to the outside of the electronic device 101. The sound output module 155 may include a speaker or a receiver, for example. The speaker may be used for general purposes, such as playing multimedia or playing record. The receiver may be used for receiving incoming calls. In an embodiment, the receiver may be implemented as separate from, or as a part of the speaker.

The display module 160 may visually provide information to the outside (e.g., a user) of the electronic device 101. The display module 160 may include a display, a hologram device, or a projector and control circuitry to control a corresponding one of the display, hologram device, and projector, for example. In an embodiment, the display module 160 may include a touch sensor adapted to detect a touch, or a pressure sensor adapted to measure the intensity of force incurred by the touch.

The audio module 170 may convert a sound into an electrical signal and vice versa. In an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. In an embodiment, the sensor module 176 may include a gesture sensor, a gyro sensor, an atmospheric pressure sensor, a magnetic sensor, an acceleration sensor, a grip sensor, a proximity sensor, a color sensor, an infrared ("IR") sensor, a biometric sensor, a temperature sensor, a humidity sensor, or an illuminance sensor, for example.

The interface 177 may support one or more specified protocols to be used for the electronic device 101 to be coupled with the external electronic device (e.g., the electronic device 102) directly (e.g., wiredly) or wirelessly. In an embodiment, the interface 177 may include a high-definition multimedia interface ("HDMI"), a universal serial bus ("USB") interface, a secure digital ("SD") card interface, or an audio interface, for example.

A connecting terminal 178 may include a connector via which the electronic device 101 may be physically connected with the external electronic device (e.g., the electronic device 102). In an embodiment, the connecting terminal 178 may include a HDMI connector, a USB connector, a SD card connector, or an audio connector (e.g., a headphone connector), for example.

The haptic module 179 may convert an electrical signal into a mechanical stimulus (e.g., a vibration or a movement) or electrical stimulus which may be recognized by a user via his tactile sensation or kinesthetic sensation. In an embodiment, the haptic module 179 may include a motor, a piezoelectric element, or an electric stimulator, for example.

The camera module 180 may capture a still image or moving images. In an embodiment, the camera module 180 may include one or more lenses, image sensors, image signal processors, or flashes.

The power management module 188 may manage power supplied to the electronic device 101. In an embodiment, the power management module 188 may be implemented as at least a part of a power management integrated circuit ("PMIC"), for example.

The battery 189 may supply power to at least one component of the electronic device 101. In an embodiment, the battery 189 may include a primary cell which is not rechargeable, a secondary cell which is rechargeable, or a fuel cell, for example.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor ("AP")) and may support a direct (e.g., wired) communication or a wireless communication. In an embodiment, the communication module 190 may include a wireless communication module 192 (e.g., a cellular communication module, a short-range wireless communication module, or a global navigation satellite system ("GNSS") communication module) or a wired communication module 194 (e.g., a local area network ("LAN") communication module or a power line communication ("PLC") module). A corresponding one of these communication modules may communicate with the external electronic device via the first network 198 (e.g., a short-range communication network, such as Bluetooth™, wireless-fidelity ("Wi-Fi") direct, or IR data association ("IrDA")) or the second network 199 (e.g., a long-range communication network, such as a legacy cellular network, a 5G network, a next-generation communication network, the Internet, or a computer network (e.g., LAN or wide area network ("WAN")). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity ("IMSI")) stored in the SIM 196.

The wireless communication module 192 may support a 5G network, after a 4G network, and next-generation communication technology, e.g., new radio ("NR") access technology. The NR access technology may support enhanced mobile broadband ("eMBB"), massive machine type communications ("mMTC"), or ultra-reliable and low-latency communications ("URLLC"). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output ("massive MIMO"), full dimensional MIMO ("FD-MIMO"), array antenna, analog beam-forming, or large-scale antenna. The wireless communication module 192 may support various requirements specified in the electronic device 101, an external electronic device (e.g., the electronic device 104), or a network system (e.g., the second network 199). In an embodiment, the wireless communication module 192 may support a peak data rate (e.g., 20 gigabits per second (Gbps) or more) for implementing eMBB, loss coverage (e.g., 164 decibels (dB) or less) for implementing mMTC, or U-plane latency (e.g., 0.5 millisecond (ms) or less for each of downlink ("DL") and uplink ("UL"), or a round trip of 1 ms or less) for implementing URLLC.

The antenna module 197 may transmit or receive a signal or power to or from the outside (e.g., the external electronic device) of the electronic device 101. In an embodiment, the antenna module 197 may include an antenna including a radiating element composed of a conductive material or a conductive pattern formed in or on a substrate (e.g., a printed circuit board ("PCB")). In an embodiment, the antenna module 197 may include a plurality of antennas (e.g., array antennas). In such a case, at least one antenna appropriate for a communication scheme used in the communication network, such as the first network 198 or the second network 199, may be selected by the communication module 190 (e.g., the wireless communication module 192) from the plurality of antennas, for example. The signal or the power may then be transmitted or received between the communication module 190 and the external electronic device via the selected at least one antenna. In an embodiment, another component (e.g., a radio frequency integrated circuit ("RFIC")) other than the radiating element may be additionally formed as a part of the antenna module 197.

In an embodiment, the antenna module 197 may form a mmWave antenna module. In an embodiment, the mmWave antenna module may include a PCB, a RFIC disposed on a first surface (e.g., the bottom surface) of the PCB, or adjacent to the first surface and capable of supporting a designated high-frequency band (e.g., the mmWave band), and a plurality of antennas (e.g., array antennas) disposed on a second surface (e.g., the top or a side surface) of the PCB, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output ("GPIO"), serial peripheral interface ("SPI"), or mobile industry processor interface ("MIPI")).

In an embodiment, commands or data may be transmitted or received between the electronic device 101 and the external electronic device 104 via the server 108 coupled with the second network 199. Each of the electronic devices 102 or 104 may be a device of a same type as or a different type from the electronic device 101. In an embodiment, all or some of operations to be executed at the electronic device 101 may be executed at one or more of the external electronic devices 102 or 104, or the server 108. In an embodiment, when the electronic device 101 should perform a function or a service automatically, or in response to a request from a user or another device, the electronic device 101, instead of, or in addition to, executing the function or the service, may request the one or more external electronic devices to perform at least a part of the function or the service. The one or more external electronic devices receiving the request may perform the at least a part of the function or the service requested, or an additional function or an additional service related to the request, and transfer an outcome of the performing to the electronic device 101. The electronic device 101 may provide the outcome, with or without further processing of the outcome, as at least a part of a reply to the request. To that end, a cloud computing, distributed computing, mobile edge computing ("MEC"), or client-server computing technology may be used, for example. The electronic device 101 may provide ultra-low-latency services using, e.g., distributed computing or MEC. In another embodiment, the external electronic device 104 may include an internet-of-things ("IoT") device. The server 108 may be an intelligent server using machine learning and/or a neural network. In an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
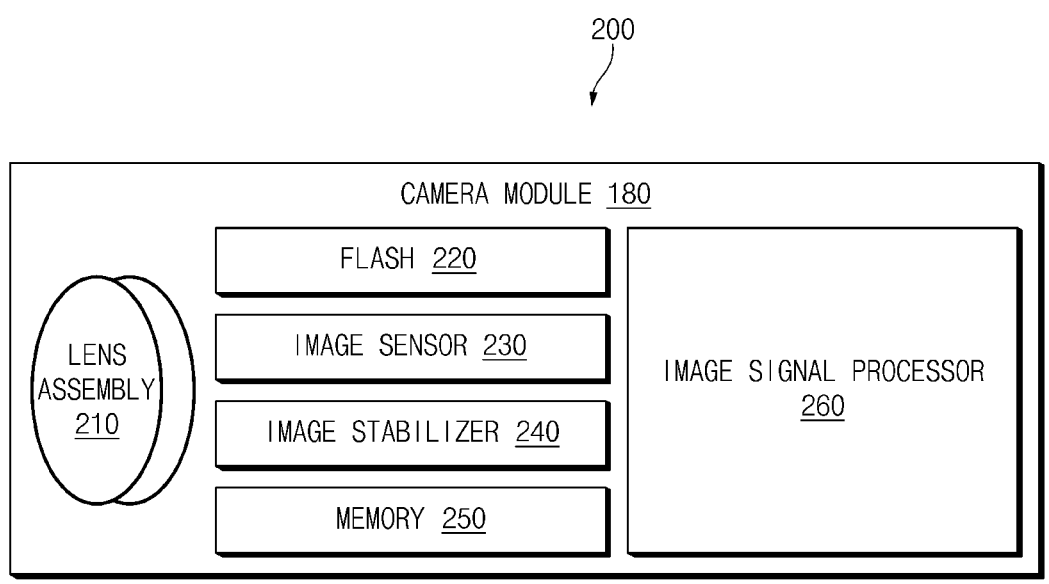
FIG. 2 is a block diagram illustrating an embodiment of a camera module.

FIG. 2 is a block diagram illustrating an embodiment of the camera module.

Referring to FIG. 2, the camera module 180 (e.g., the camera module 305, 312 of FIGS. 3A, 3B and 3C, or the camera module 400 of FIG. 4) may include a lens assembly 210 (e.g., the lens assembly 410 of FIG. 4), a flash 220, an image sensor 230, an image stabilizer 240, a memory 250 (e.g., buffer memory), or an image signal processor 260.

The lens assembly 210 may collect light emitted or reflected from an object whose image is to be taken. The lens assembly 210 may include one or more lenses. In an embodiment, the camera module 180 may include a plurality of lens assemblies 210. In such a case, the camera module 180 may form, e.g., a dual camera, a 360-degree camera, or a spherical camera. Some of the plurality of lens assemblies 210 may have the same lens attribute (e.g., view angle, focal length, auto-focusing, f number, or optical zoom) as each other, or at least one lens assembly may have one or more lens attributes different from those of another lens assembly. The lens assembly 210 may include a wide-angle lens or a telephoto lens, for example.

The flash 220 may emit light that is used to reinforce light reflected from an object. In an embodiment, the flash 220 may include one or more light-emitting diodes ("LEDs") (e.g., a red-green-blue ("RGB") LED, a white LED, an IR LED, or an ultraviolet ("UV") LED) or a xenon lamp.

The image sensor 230 may obtain an image corresponding to an object by converting light emitted or reflected from the object and transmitted via the lens assembly 210 into an electrical signal. In an embodiment, the image sensor 230 may include one selected from image sensors having different attributes, such as a RGB sensor, a black-and-white ("BW") sensor, an IR sensor, or a UV sensor, a plurality of image sensors having the same attribute, or a plurality of image sensors having different attributes. Each image sensor included in the image sensor 230 may be implemented using a charged coupled device ("CCD") sensor or a complementary metal oxide semiconductor ("CMOS") sensor, for example.

The image stabilizer 240 may move the image sensor 230 or at least one lens included in the lens assembly 210 in a particular direction, or control an operational attribute (e.g., adjust the read-out timing) of the image sensor 230 in response to the movement of the camera module 180 or the electronic device 101 including the camera module 180. This allows compensating for at least a part of a negative effect (e.g., image blurring) by the movement on an image being captured. In an embodiment, the image stabilizer 240 may sense such a movement by the camera module 180 or the electronic device 101 using a gyro sensor (not shown) or an acceleration sensor (not shown) disposed inside or outside the camera module 180. In an embodiment, the image stabilizer 240 may be implemented as an optical image stabilizer, for example.

The memory 250 may store, at least temporarily, at least a part of an image obtained via the image sensor 230 for a subsequent image processing task. In an embodiment, when image capturing is delayed due to shutter lag or multiple images are quickly captured, a raw image obtained (e.g., a Bayer-patterned image, a high-resolution image) may be stored in the memory 250, and its corresponding copy image (e.g., a low-resolution image) may be previewed via the display module 160. Thereafter, when a specified condition is met (e.g., by a user's input or system command), at least a part of the raw image stored in the memory 250 may be obtained and processed by the image signal processor 260, for example. In an embodiment, the memory 250 may be configured as at least a part of the memory 130 or as a separate memory that is operated independently from the memory 130.

The image signal processor 260 may perform one or more image processing with respect to an image obtained via the image sensor 230 or an image stored in the memory 250. The one or more image processing may include depth map generation, three-dimensional ("3D") modeling, panorama generation, feature point extraction, image synthesizing, or image compensation (e.g., noise reduction, resolution adjustment, brightness adjustment, blurring, sharpening, or softening), for example. Additionally or alternatively, the image signal processor 260 may perform control (e.g., exposure time control or read-out timing control) with respect to at least one (e.g., the image sensor 230) of the components included in the camera module 180. An image processed by the image signal processor 260 may be stored back in the memory 250 for further processing, or may be provided to an external component (e.g., the memory 130, the display module 160, the electronic device 102, the electronic device 104, or the server 108) outside the camera module 180.

In an embodiment, the image signal processor 260 may be configured as at least a part of the processor 120, or as a separate processor that is operated independently from the processor 120. When the image signal processor 260 is configured as a separate processor from the processor 120, at least one image processed by the image signal processor 260 may be displayed, by the processor 120, via the display module 160 as it is or after being further processed.

In an embodiment, the electronic device 101 may include a plurality of camera modules 180 having different attributes or functions. In such a case, at least one of the plurality of camera modules 180 may form a wide-angle camera and at least another of the plurality of camera modules 180 may form a telephoto camera, for example. Similarly, at least one of the plurality of camera modules 180 may form a front camera and at least another of the plurality of camera modules 180 may form a rear camera, for example.

Figure 3A:
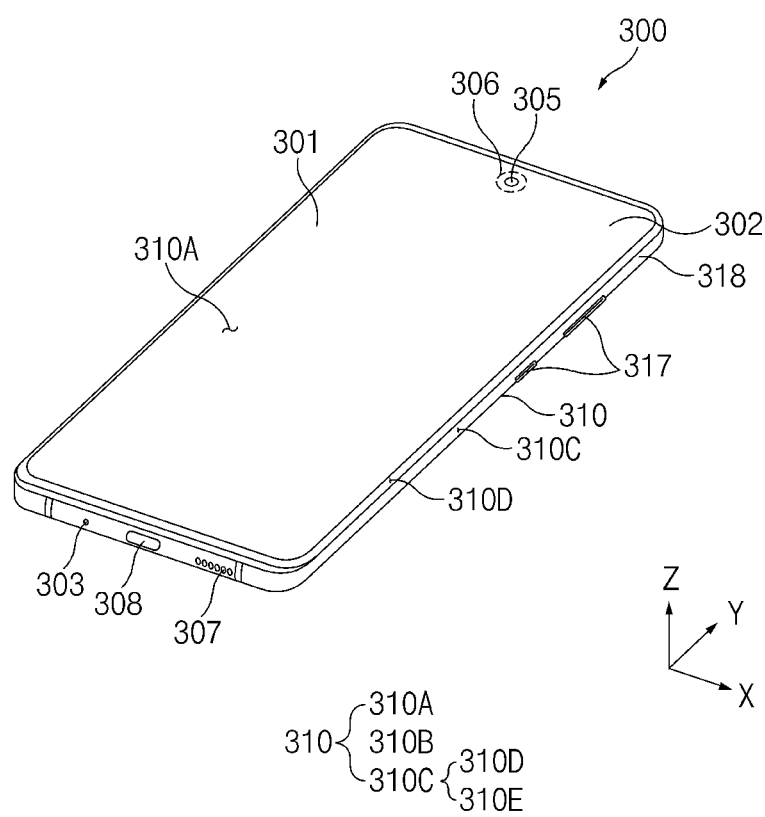
FIG. 3A is a front perspective view of an embodiment of an electronic device.
Figure 3B:
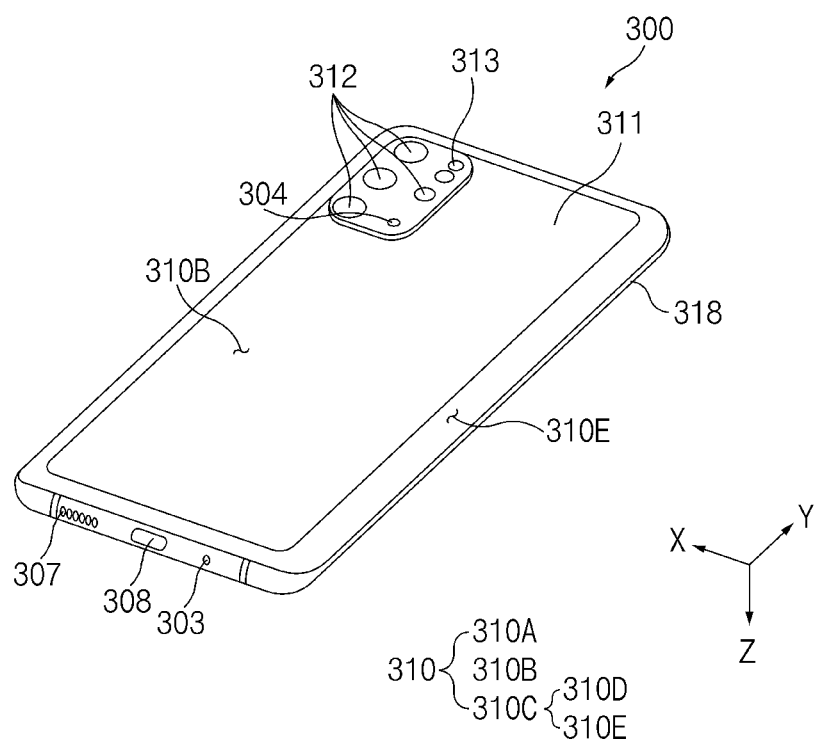
FIG. 3B is a rear perspective view of an embodiment of the electronic device.
Figure 3C:
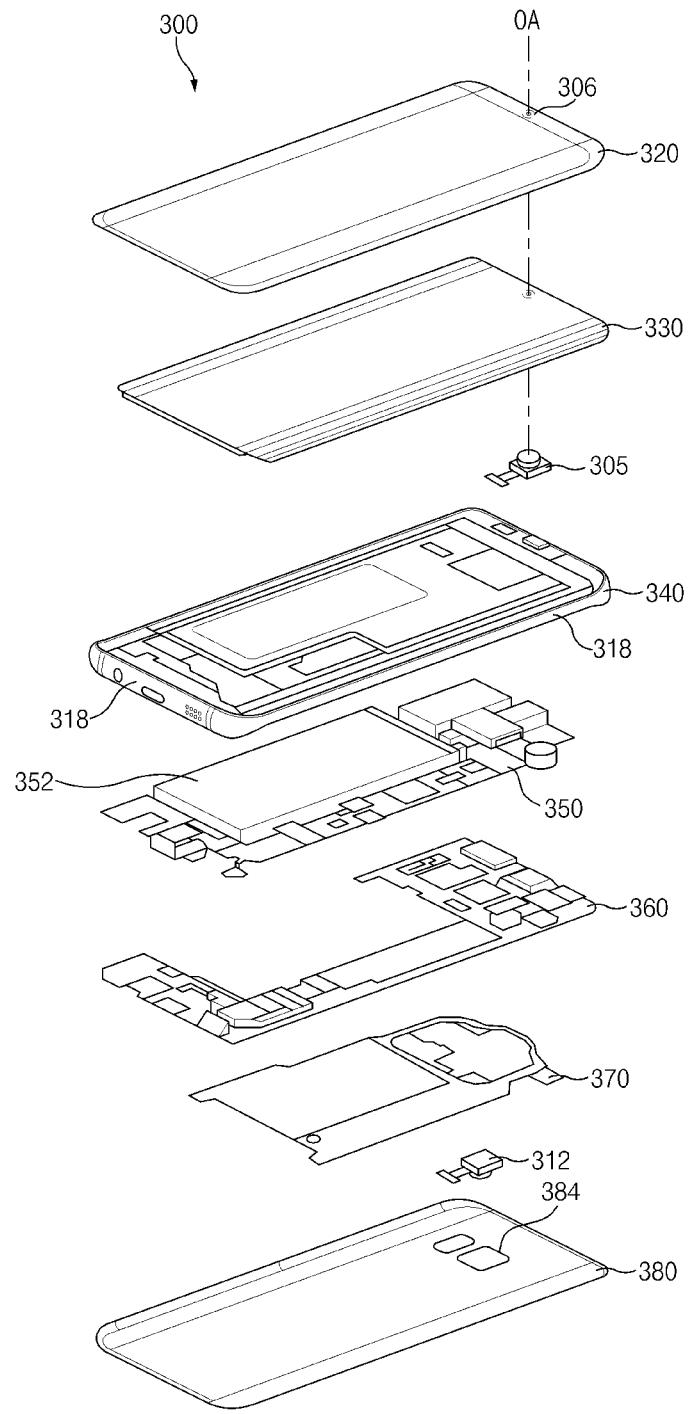
FIG. 3C is an exploded perspective view of an embodiment of the electronic device.

FIG. 3A is a front perspective view of an embodiment of an electronic device 300. FIG. 3B is a rear perspective view of an embodiment of the electronic device 300. FIG. 3C is an exploded perspective view of an embodiment of electronic device 300.

Referring to FIGS. 3A and 3B, the electronic device 300 may include a housing 310 that includes a first surface (or, a front surface) 310A, a second surface (or, a rear surface) 310B, and a side surface 310C surrounding a space between the first surface 310A and the second surface 310B.

In another embodiment (not illustrated), the housing 310 may refer to a structure that forms some of the first surface 310A, the second surface 310B, and the side surface 310C.

In an embodiment, the first surface 310A may be formed by a front plate 302 (e.g., a front plate 320 of FIG. 3C), at least a portion of which is substantially transparent. The front plate 302 may include a glass plate including various coating layers or a polymer plate. In an embodiment, the second surface 310B may be formed by a back plate 311 (e.g., a back plate 380 of FIG. 3C) that is substantially opaque. The back plate 311 may include coated or colored glass, ceramic, a polymer, metal (e.g., aluminum, stainless steel ("STS"), or magnesium), or a combination of at least two of the aforementioned materials, for example. The side surface 310C may be formed by a side bezel structure 318 that is coupled with the front plate 302 and the back plate 311 and that includes metal and/or a polymer.

In another embodiment, the back plate 311 and the side bezel structure 318 may be unitary with each other and may include the same material (e.g., a metallic material such as aluminum).

In the illustrated embodiment, the front plate 302 may include two first areas 310D that curvedly and seamlessly extend from partial areas of the first surface 310A toward the back plate 311. The first areas 310D may be located at opposite long edges of the front plate 302.

In the illustrated embodiment, the back plate 311 may include two second areas 310E that curvedly and seamlessly extend from partial areas of the second surface 310B toward the front plate 302. The second areas 310E may be located at opposite long edges of the back plate 311.

In another embodiment, the front plate 302 (or the back plate 311) may include only one of the first areas 310D (or the second areas 310E). Furthermore, in another embodiment, the front plate 302 (or the back plate 311) may not include a part of the first areas 310D (or the second areas 310E).

In an embodiment, when viewed from a side of the electronic device 300, the side bezel structure 318 may have a first thickness (or, width) at sides (e.g., short sides) not including the first areas 310D or the second areas 310E and may have a second thickness at sides (e.g., long sides) including the first areas 310D or the second areas 310E. In an embodiment, the second thickness may be smaller than the first thickness.

In an embodiment, the electronic device 300 may include at least one of a display 301 (e.g., the display module 160 of FIG. 1), audio modules 303, 304, and 307 (e.g., the audio module 170 of FIG. 1), a sensor module (not illustrated) (e.g., the sensor module 176 of FIG. 1), camera modules 305 and 312 (e.g., the camera module 180 of FIG. 1 or a camera module 400 of FIG. 4), key input devices 317 (e.g., the input module 150 of FIG. 1), or a light-emitting element (not illustrated). In an embodiment, a connector hole 308 (e.g., the connecting terminal 178 of FIG. 1) may be defined in the electronic device 300. In another embodiment, at least one component (e.g., the key input devices 317 or the light-emitting element (not illustrated)) among the aforementioned components may be omitted from the electronic device 300, or other component(s) may be additionally included in the electronic device 300.

In an embodiment, the display 301 may be exposed through at least a portion of the front plate 302. In an embodiment, at least a portion of the display 301 may be exposed through the front plate 302 that includes the first surface 310A and the first areas 310D of the side surface 310C, for example.

In an embodiment, the shape of the display 301 may be substantially the same as the shape of the adjacent outside edge of the front plate 302. In another embodiment (not illustrated), to expand the area by which the display 301 is exposed, the gap between the periphery of the display 301 and the periphery of the front plate 302 may be substantially constant.

In an embodiment, a surface of the housing 310 (or the front plate 302) may include a display area through which the display 301 is visually exposed and on which contents are displayed through pixels. In an embodiment, the display area may include the first surface 310A and the first areas 310D of the side surface, for example.

In another embodiment (not illustrated), the display area 310A and 310D may include a sensing area (not illustrated) that obtains biometric information of a user. When the display area 310A and 310D includes the sensing area, this may mean that at least a portion of the sensing area overlaps the display area 310A and 310D. In an embodiment, the sensing area (not illustrated) may refer to an area capable of displaying contents by the display 301 like the other areas of the display area 310A and 310D and additionally obtaining biometric information (e.g., a fingerprint) of the user, for example.

In an embodiment, the display area 310A and 310D of the display 301 may include a camera area 306. In an embodiment, the camera area 306 may be an area through which light reflected from an object is received by the first camera module 305, for example. In an embodiment, the camera area 306 may include an area through which an optical axis of the first camera module 305 (e.g., an optical axis OA of FIG. 4) passes, for example. When the display area 310A and 310D includes the camera area 306, this may mean that at least a portion of the camera area 306 overlaps the display area 310A and 310D. In an embodiment, likewise to the other areas of the display area 310A and 310D, the camera area 306 may display contents by the display 301, for example.

In various embodiments (not illustrated), the screen display area 310A and 310D of the display 301 may include an area through which the first camera module 305 (e.g., a punch hole camera) is visually exposed. In an embodiment, at least a portion of the periphery of the area through which the first camera module 305 is exposed may be surrounded by the screen display area 310A and 310D, for example. In an embodiment, the first camera module 305 may include a plurality of camera modules (e.g., the camera module 180 of FIG. 1 and the camera module 400 of FIG. 4).

In an embodiment, the display 301 may include, on the rear surface of the screen display area 310A and 310D, at least one of the audio modules 303, 304, and 307, the sensor module (not illustrated), a camera module (e.g., the first camera module 305), or the light-emitting element (not illustrated). In an embodiment, the electronic device 300 may include the camera module (e.g., the first camera module 305) disposed on the rear side (e.g., the side facing the −Z-axis direction) of the first surface 310A (e.g., the front surface) and/or the side surface 310C (e.g., at least one surface of the first areas 310D) to face toward the first surface 310A and/or the side surface 310C, for example. In an embodiment, the first camera module 305 may include an under-display camera ("UDC") that is hidden without being visually exposed on the screen display area 310A and 310D, for example.

In another embodiment (not illustrated), the display 301 may include, or may be disposed adjacent to, touch detection circuitry, a pressure sensor for measuring the intensity (pressure) of a touch, and/or a digitizer for detecting a stylus pen of a magnetic field type.

In an embodiment, the audio modules 303, 304, and 307 may include the microphone holes 303 and 304 and the speaker hole 307.

In an embodiment, the microphone holes 303 and 304 may include the first microphone hole 303 defined in a partial area of the side surface 310C and the microphone hole 304 defined in a partial area of the second surface 310B. Microphones for obtaining external sounds may be disposed in the housing 310 to correspond to the microphone holes 303 and 304. The microphones may each include a plurality of microphones to detect the direction of sound. In an embodiment, the second microphone hole 304 defined in the partial area of the second surface 310B may be disposed adjacent to the camera modules 305 and 312. In an embodiment, the second microphone hole 304 may obtain sounds when the camera modules 305 and 312 are executed, or may obtain sounds when other functions are executed, for example.

In an embodiment, the speaker hole 307 may include a receiver hole for telephone call (not illustrated). The speaker hole 307 may be defined in a portion of the side surface 310C of the electronic device 300. In another embodiment, the speaker hole 307, together with the microphone hole 303, may be implemented as a single hole. One or more slits 450 or a recess and the receiver hole for telephone call (not illustrated) may be defined in another portion of the side surface 310C. In an embodiment, the receiver hole for telephone call (not illustrated) may be defined in another portion (e.g., a portion facing the +Y-axis direction) of the side surface 310C that faces the portion (e.g., a portion facing the −Y-axis direction) of the side surface 310C in which the speaker hole 307 is defined, for example.

In an embodiment, the electronic device 300 may include a speaker fluidly connected with the speaker hole 307. In another embodiment, the speaker may include a piezoelectric speaker in which the speaker hole 307 is not defined.

In an embodiment, the sensor module (not illustrated) (e.g., the sensor module 176 of FIG. 1) may generate an electrical signal or a data value that corresponds to an operational state inside the electronic device 300 or an environmental state external to the electronic device 300. In an embodiment, the sensor module (not illustrated) may be disposed on at least a part of the first surface 310A, the second surface 310B, or the side surface 310C (e.g., the first areas 310D and/or the second areas 310E) of the housing 310 and may be disposed on the rear surface of the display 301 (e.g., a fingerprint sensor). In an embodiment, at least a portion of the sensor module (not illustrated) may be disposed under the display area 310A and 310D and may not be visually exposed, and the sensing area (not illustrated) may be formed in at least a portion of the display area 310A and 310D, for example. In an embodiment, the sensor module (not illustrated) may include an optical fingerprint sensor, for example. In some embodiments (not illustrated), the fingerprint sensor may be disposed on the second surface 310B as well as the first surface 310A of the housing 310 (e.g., the screen display area 310A and 310D). In an embodiment, the sensor module may include at least one of a proximity sensor, a heart rate monitor ("HRM") sensor, a fingerprint sensor, a gesture sensor, a gyro sensor, an atmospheric pressure sensor, a magnetic sensor, an acceleration sensor, a grip sensor, a color sensor, an IR sensor, a biosensor, a temperature sensor, a humidity sensor, or an illuminance sensor, for example.

In an embodiment, the key input devices 317 may be disposed on the side surface 310C of the housing 310 (e.g., the first areas 310D and/or the second areas 310E). In another embodiment, the electronic device 300 may not include all or some of the key input devices 317, and the key input devices 317 not included may be implemented in a different form, such as a soft key, on the display 301. In another embodiment, the key input devices may include a sensor module (not illustrated) that forms the sensing area (not illustrated) that is included in the display area 310A and 310D.

In an embodiment, the connector hole 308 may accommodate a connector. The connector hole 308 may be defined in the side surface 310C of the housing 310. In an embodiment, the connector hole 308 may be defined in the side surface 310C so as to be adjacent to at least a part of the audio modules (e.g., the microphone hole 303 and the speaker hole 307), for example. In another embodiment, the first connector hole 308 capable of accommodating a connector (e.g., a USB connector) for transmitting/receiving power and/or data with an external electronic device, and/or a second connector hole (not illustrated) capable of accommodating a connector (e.g., an earphone jack) for transmitting/receiving audio signals with an external electronic device may be defined in the electronic device 300.

In an embodiment, the electronic device 300 may include the light-emitting element (not illustrated). In an embodiment, the light-emitting element (not illustrated) may be disposed on the first surface 310A of the housing 310, for example. The light-emitting element (not illustrated) may provide state information of the electronic device 300 in the form of light. In another embodiment, the light-emitting element (not illustrated) may provide a light source that operates in conjunction with operation of the first camera module 305. In an embodiment, the light-emitting element (not illustrated) may include an LED, an IR LED, and/or a xenon lamp, for example.

In an embodiment, the camera modules 305 and 312 (e.g., the camera module 180 of FIG. 1 and the camera module 400 of FIG. 4) may include the first camera module 305 (e.g., a UDC) which receives light through the camera area 306 in the first surface 310A of the electronic device 300, the second camera module 312 which receives light through a partial area of the second surface 310B (e.g., a rear camera area (also referred to as a second camera area) 384 of FIG. 3C), and/or a flash 313.

In an embodiment, the first camera module 305 may include a UDC disposed on the rear surface of the display 301. In an embodiment, the first camera module 305 may be disposed in some layers of the display 301, or may be disposed such that an optical axis of a lens (e.g., the optical axis OA of FIG. 4) passes through the display area 310A and 310D of the display, for example. In various embodiments, the first camera module 305 may receive light through the camera area 306 included in the display area 310A and 310D. In an embodiment, the camera area 306 may display contents like the other areas of the display area 310A and 310D when the first camera module 305 does not operate, for example. In an embodiment, when the first camera module 305 operates, the camera area 306 may not display contents, and the first camera module 305 may receive light through the camera area 306, for example.

In various embodiments (not illustrated), the first camera module 305 (e.g., a punch hole camera) may be exposed through a portion of the display area 310A and 310D of the display 301. In an embodiment, the first camera module 305 may be exposed on a partial area of the screen display area 310A and 310D through an opening defined in a portion of the display 301, for example.

In an embodiment, the second camera module 312 may include a plurality of camera modules (e.g., a dual camera, a triple camera, or a quad camera). However, the second camera module 312 is not necessarily limited to including the plurality of camera modules and may include one camera module.

In an embodiment, the first camera module 305 and/or the second camera module 312 may include one or more lenses, an image sensor (e.g., the image sensor 230 of FIG. 2), and/or an image signal processor (e.g., the image signal processor 260 of FIG. 2). The flash 313 may include a light-emitting diode or a xenon lamp, for example. In another embodiment, two or more lenses (an IR camera lens, a wide-angle lens, and a telephoto lens) and image sensors may be disposed in the housing to face a direction that one surface (e.g., the second surface 310B) of the electronic device 300 faces.

Referring to FIG. 3C, the electronic device 300 may include the side bezel structure 318, a first support member 340 (e.g., a bracket), the front plate 320 (e.g., the front plate 302 of FIG. 3A), a display 330 (e.g., the display 301 of FIG. 3A), a PCB 350 (e.g., a flexible PCB ("FPCB"), or a rigid-flexible PCB ("RFPCB")), a battery 352, a second support member 360 (e.g., a rear case), an antenna 370, and the back plate 380 (e.g., the back plate 311 of FIG. 3B). In some embodiments, the electronic device 300 may not include at least one component (e.g., the first support member 340 or the second support member 360) among the aforementioned components, or may additionally include other component(s). At least one of the components of the electronic device 300 may be identical or similar to at least one of the components of the electronic device 300 of FIG. 3A or 3B, and repetitive descriptions will hereinafter be omitted.

In an embodiment, the first support member 340 may be disposed inside the electronic device 300 and may be connected with the side bezel structure 318, or may be unitary with the side bezel structure 318. The first support member 340 may include a metallic material and/or a nonmetallic (e.g., polymer) material, for example. The display 330 may be coupled to, or disposed on, one surface of the first support member 340, and the PCB 350 may be coupled to, or disposed on, an opposite surface of the first support member 140.

In an embodiment, a processor, a memory, and/or an interface may be disposed on the PCB 350. The processor may include one or more of a central processing unit, an application processor, a graphic processing unit, an image signal processor, a sensor hub processor, or a communication processor, for example.

In an embodiment, the memory may include a volatile memory or a nonvolatile memory, for example.

In an embodiment, the interface may include a HDMI, a USB interface, an SD card interface, and/or an audio interface, for example. In an embodiment, the interface may electrically or physically connect the electronic device 300 with an external electronic device and may include a USB connector, an SD card/MMC connector, or an audio connector, for example.

In an embodiment, the battery 352, which is a device for supplying power to at least one component of the electronic device 300, may include a primary cell that is not rechargeable, a secondary cell that is rechargeable, or a fuel cell, for example. At least a portion of the battery 352, e.g., may be disposed on substantially the same plane as the PCB 350. The battery 352 may be integrally disposed inside the electronic device 300, or may be detachable from the electronic device 300.

In an embodiment, the antenna 370 may be disposed between the back plate 380 and the battery 352. The antenna 370 may include a near field communication (NFC) antenna, a wireless charging antenna, and/or a magnetic secure transmission (MST) antenna, for example. In an embodiment, the antenna 370 may perform short-range communication with an external device, or may wirelessly transmit and receive power desired for charging, for example. In another embodiment, an antenna structure may be formed by a portion of the side bezel structure 318 and/or a portion of the first support member 340, or any combinations thereof.

In an embodiment, the first camera module 305 may be coupled to the rear surface of the display 330 to receive light through the camera area 306 of the front plate 320. In an embodiment, at least a portion of the first camera module 305 may be disposed on the first support member 340, for example. In an embodiment, the image sensor of the first camera module 305 (e.g., the image sensor 230 of FIG. 2) may receive light passing through the camera area 306 and a pixel array included in the display 330, for example. In an embodiment, the camera area 306 may at least partially overlap the display area on which contents are displayed, for example. In an embodiment, the optical axis OA of the first camera module 305 may pass through a partial area of the display 330 and the camera area 306 of the front plate 320, for example. In an embodiment, the partial area may include a pixel array including a plurality of light-emitting elements, for example. In an embodiment, a partial area of the display 330 that faces the first camera module 305 may be a transmissive area that has a specified transmittance as a portion of the display area on which contents are displayed. In an embodiment, the transmissive area may have a transmittance of about 5% to about 25%. In an embodiment, the transmissive area may have a transmittance of about 25% to about 50%. In an embodiment, the transmissive area may have a transmittance of about 50% or more. The transmissive area may include an area through which light focused on the image sensor (e.g., the image sensor 230 of FIG. 2) to generate an image passes and that overlaps an effective area (e.g., a field of view (FOV)) of the first camera module 305. In an embodiment, the transmissive area of the display 330 may include an area having a lower pixel density and/or wiring density than a surrounding area, for example.

In an embodiment, the second camera module 312 may be disposed such that a lens is exposed through the rear camera area 384 of the back plate 380 of the electronic device 300 (e.g., the rear surface 310B of FIG. 2). The rear camera area 384 may be formed in at least a portion of a surface of the back plate 380 (e.g., the rear surface 310B of FIG. 2). In an embodiment, the second camera area 384 may be at least partially transparent such that the second camera module 312 receives external light through the second camera area 384.

In an embodiment, at least a portion of the rear camera area 384 may protrude to a predetermined height from the surface of the back plate 380. However, without being necessarily limited thereto, the rear camera area 384 may form substantially the same plane as the surface of the back plate 380.

Figure 4:
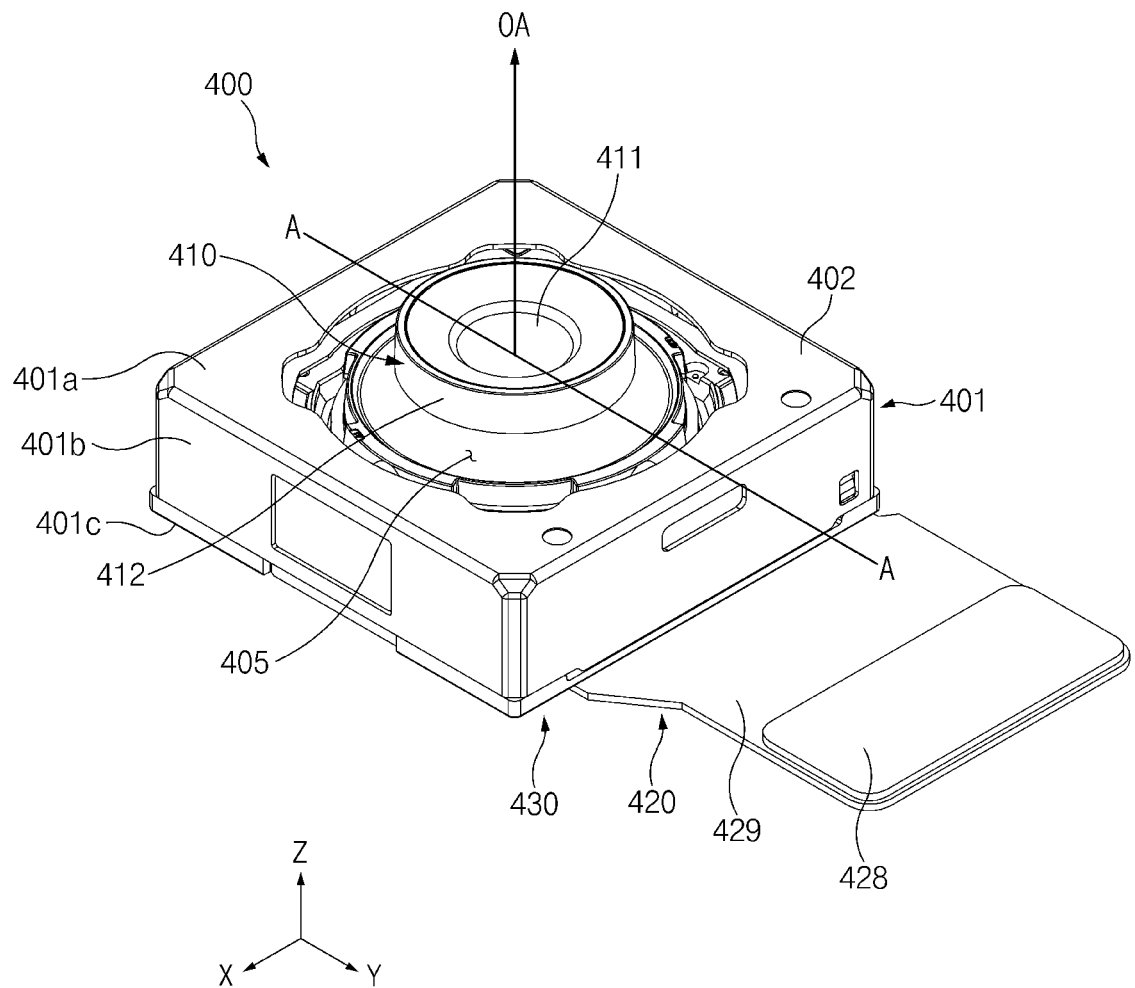
FIG. 4 is a perspective view of an embodiment of a camera module.
Figure 5:
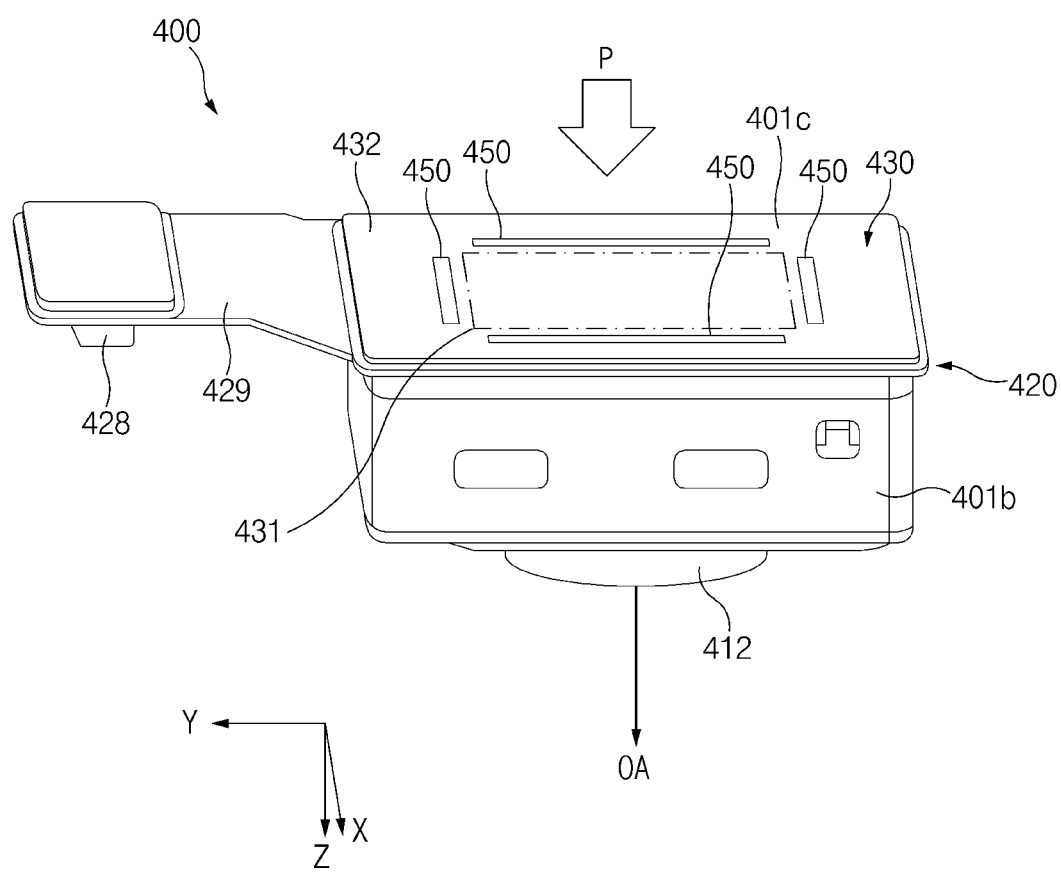
FIG. 5 is a perspective view of the camera module.

FIG. 4 is a perspective view of an embodiment of a camera module. FIG. 5 is a perspective view of an embodiment of the camera module.

The illustrated camera module 400 may be also referred to as the camera module 180 of FIG. 1, the first camera module 305 of FIG. 3A, and the second camera module 312 of FIG. 3B.

Referring to FIGS. 4 and 5, the camera module 400 in an embodiment may include a camera housing 401, a lens assembly 410 (e.g., the lens assembly 210 of FIG. 2), at least a portion of which is accommodated in the camera housing 401, a circuit board 420, and a metal plate 430. In an embodiment, the camera module 400 may receive external light through a partial area (e.g., the camera area 306 or the rear camera area 384 of FIG. 3C) of a surface of an electronic device (e.g., the electronic device 300 of FIGS. 3A to 3C).

In an embodiment, the camera housing 401 may include a cover 402. The cover 402 may be also referred to as a shield can. The cover 402 may form an upper surface 401a and a side surface 401b of the camera module 400. The cover 402 may at least partially surround the lens assembly 410, the circuit board 420, and an image sensor 421. An opening 405 in which the lens assembly 410 is at least partially disposed may be defined in a partial area of the cover 402 (e.g., the upper surface 401a of the camera module 400). The opening 405 may be at least partially aligned with the optical axis OA of a lens 411. In an embodiment, the lens 411 and a portion of a lens barrel 412 may be exposed, or may protrude, through the opening 405, for example. The lens 411 may receive external light through the opening 405. In various embodiments, the camera housing 401 may refer to the cover 402 and the metal plate 430 forming a lower surface 401c of the camera module 400.

In an embodiment, the lens assembly 410 may include one or more lenses 411 and the lens barrel 412 surrounding the one or more lenses 411. The lenses 411 and a portion of the lens barrel 412 may be exposed, or may protrude outside the camera housing 401, through the opening 405 of the cover 402.

In an embodiment, the circuit board 420 may be at least partially disposed on the metal plate 430. In an embodiment, the circuit board 420 may be attached to the metal plate 430, for example. In an embodiment, the circuit board 420 may have the image sensor 421 disposed thereon, or may be electrically connected to the image sensor 421. In an embodiment, the circuit board 420 may be at least partially flexible. In an embodiment, the circuit board 420 may include a FPCB, for example. In various embodiments, the circuit board 420 may be unitary with a connecting member 429.

In an embodiment, the connecting member 429 may extend outside the camera housing 401 from the circuit board 420. The connecting member 429 may include a connector 428. In an embodiment, the connector 428 may be coupled to a PCB of the electronic device 300 (e.g., the PCB 350 of FIG. 3C), for example.

In an embodiment, the metal plate 430 may include an area to which the circuit board 420 is attached. In an embodiment, the metal plate 430 may overlap the circuit board 420 when viewed in the direction of the optical axis OA (e.g., the z-axis), for example. In various embodiments, the circuit board 420 and/or the image sensor 421 may be disposed on the metal plate 430. In an embodiment, the metal plate 430 may form the lower surface 401c of the camera module 400. In an embodiment, the metal plate 430, together with the cover 402, may form the camera housing 401, for example.

In an embodiment, the metal plate 430 may include a first surface (e.g., a first surface 430a of FIG. 6) to which the circuit board 420 is attached and a second surface (e.g., a second surface 430b of FIG. 6) that forms the lower surface 401c of the camera module 400. In an embodiment, the image sensor 421 may be attached to the circuit board 420, or may be attached to the first surface 430a of the metal plate 430.

In an embodiment, an image sensor (e.g., the image sensor 230 of FIG. 2 or the image sensor 421 of FIG. 6) may convert an optical signal condensed through the lenses 411 into an electrical signal. The image sensor 421 may be electrically connected to the processor of the electronic device 101 or 300 (e.g., the processor 120 of FIG. 1 or the image signal processor 260 of FIG. 2) through the circuit board 420. In an embodiment, the electrical signal generated by the image sensor 421 may be transmitted to the processor 120 or 260 of the electronic device 101 or 300 through the circuit board 420, the connecting member 429, and the connector 428.

Referring to FIG. 5, an external force P may be applied to the lower surface 401c of the camera module 400. The external force P may act in a direction toward an inner space of the camera housing 401. In an embodiment, the external force P may include an external force generated in a process of assembling the camera module 400 into the electronic device 300. In an embodiment, bending stress caused by the external force may act on the metal plate 430. The bending stress may act to partially bend the metal plate 430, for example.

Referring to FIG. 5, the metal plate 430 may include a first area 431 (e.g., an area illustrated by a dotted line in the drawing) that corresponds to the image sensor 421 and a second area 432 that surrounds the first area 431. In an embodiment, the second area 432 may be defined as an area around the first area 431, for example. In an embodiment, the first area 431 may be defined as an area that overlaps the image sensor 421 when viewed in the direction of the optical axis OA (e.g., the z-axis). In an embodiment, the image sensor 421 may be disposed on the first surface included in the first area 431 of the metal plate 430, for example. In an embodiment, the image sensor 421 may be disposed (e.g., mounted) on the circuit board 420 attached to the first area 431 of the metal plate 430, for example.

In an embodiment, one or more slits 450 or a recess may be defined in the second area 432 of the metal plate 430. The one or more slits 450 may pass through the first surface from the second surface of the metal plate 430. The recess (e.g., a recess 470 of FIG. 14A) may be defined in the second surface of the metal plate 430. In various embodiments, the one or more slits 450 or the recess may be defined in an area outside the area corresponding to the image sensor 421. Referring to FIG. 5, a plurality of slits 450 or a recess (e.g., the recess 470 of FIG. 14A) extending in directions parallel to the edges of the first area 431 or the image sensor 421 may be defined in the second area 432 of the metal plate 430.

In an embodiment, the one or more slits 450 or the recess may reduce or prevent damage applied to the image sensor 421 by the external force P acting on the metal plate 430 or the bending stress acting on the metal plate 430. In an embodiment, the second area 432 may be easily bent by the one or more slits 450 or the recess when the external force or the bending stress acts, for example. Accordingly, the image sensor 421 may be protected by reducing the bending stress acting on the first area 431, which corresponds to the image sensor 421, and the image sensor 421.

Figure 6:
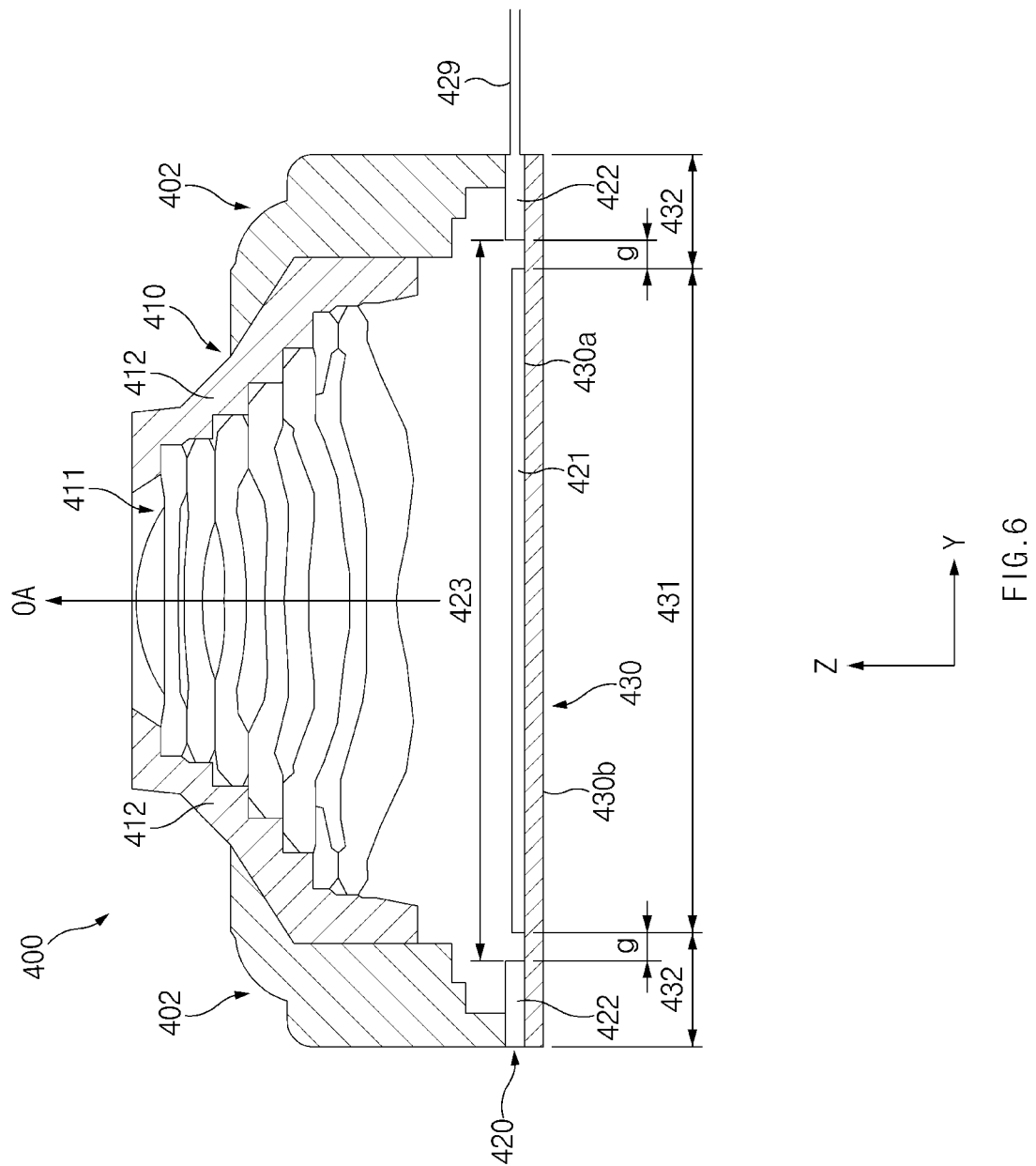
FIG. 6 is a cross-sectional view of an embodiment of the camera module.
Figure 7:
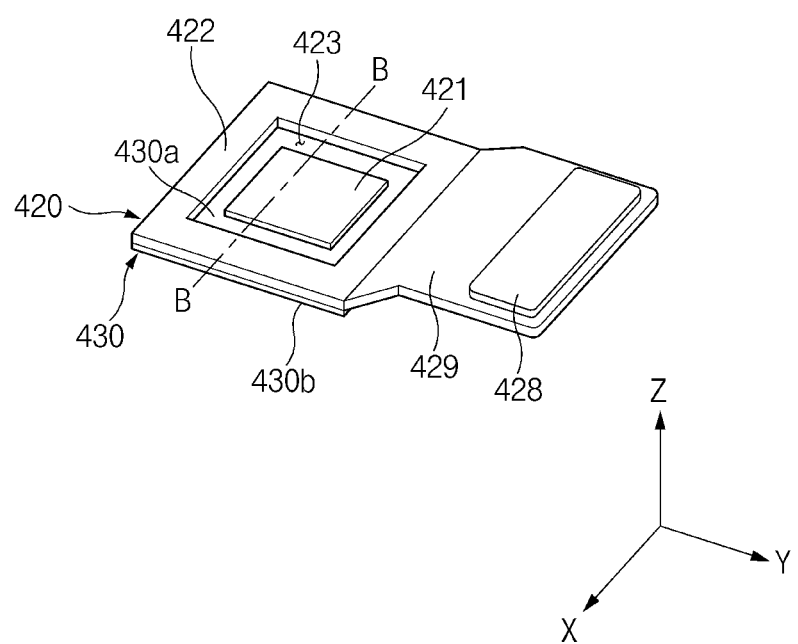
FIG. 7 is a view illustrating an embodiment of a circuit board and a metal plate of the camera module.

FIG. 6 is a cross-sectional view of an embodiment of the camera module. FIG. 7 is a view illustrating an embodiment of the circuit board and the metal plate of the camera module. FIG. 6 is a cross-sectional view taken along line A-A of FIG. 4.

Referring to FIGS. 6 and 7, the camera module 400 may include the cover 402, the metal plate 430, the lens assembly 410, the circuit board 420, and the image sensor 421. The cover, together with the metal plate 430, may define the inner space of the camera module 400. In an embodiment, the lens assembly 410 may be at least partially disposed in the inner space of the camera module 400. The lens assembly 410 may include the lens barrel 412 and the plurality of lenses 411 surrounded by the lens barrel 412. In an embodiment, the image sensor 421 may be disposed on the first surface 430a of the metal plate 430 and may be at least partially aligned with the optical axis OA. The image sensor 421 may be electrically connected with the circuit board 420.

Referring to FIGS. 6 and 7, in an embodiment, the circuit board 420 may include an opening area 423 and a peripheral area 422 surrounding the opening area 423. The side portion of the cover 402 may be connected to the peripheral area 422 of the circuit board 420. In an embodiment, the peripheral area 422 of the circuit board 420 may be attached to the first surface 430a of the metal plate 430, and a partial area of the first surface 430a of the metal plate 430 may be visible through the opening area 423 of the circuit board 420, for example.

In an embodiment, the peripheral area 422 of the circuit board 420 may surround the image sensor 421. In an embodiment, the image sensor 421 may be disposed in the opening area 423 of the circuit board 420, for example. In an embodiment, the height of the peripheral area 422 of the circuit board 420 may be greater than the height of the image sensor 421, for example. In an embodiment, the peripheral area 422 of the circuit board 420 and the image sensor 421 may be spaced apart from each other by a predetermined gap g. In an embodiment, the circuit board 420 may be connected with the image sensor 421 through wire bonding. In an embodiment, when viewed in the direction of the optical axis OA (e.g., the z-axis direction), the first area 431 of the metal plate 430 may be located in the opening area 423 of the circuit board 420. In an embodiment, the peripheral area 422 may surround a portion of the second area 432 of the metal plate 430 and the first area 431 thereof. In an embodiment, the connecting member 429 may extend from the peripheral area 422 of the circuit board 420.

Referring to FIGS. 6 and 7, the metal plate 430 may include the first surface 430a to which the image sensor 421 and the circuit board 420 are attached and the second surface 430b opposite to the first surface 430a. The second surface 430b may form the lower surface of the camera module 400 (e.g., the lower surface 401c of FIG. 4). In an embodiment, the metal plate 430 may include the first area 431 on which the image sensor 421 is disposed and the second area 432 around the first area 431. Referring to FIG. 6, the second area 432 of the metal plate 430 may include an area to which the peripheral area 422 of the circuit board 420 is attached and an area exposed through the gap g between the image sensor 421 and the circuit board 420. The image sensor 421 may be attached to the first surface 430a included in the first area 431, and the peripheral area 422 of the circuit board 420 may be attached to the first surface 430a included in the second area 432.

Referring to FIG. 6, the first area 431 of the metal plate 430 may be defined to have the same area as the image sensor 421. In an embodiment, the first area 431 may be smaller than the opening area 423 of the circuit board 420, for example. In an embodiment, when viewed in the direction of the optical axis OA (e.g., the z-axis direction), the first area 431 may be located in the opening area 423, for example. When viewed in the direction of the optical axis OA, the first area 431 may be surrounded by the peripheral area 422 of the circuit board 420.

In an embodiment, the circuit board 420 may be attached to the first surface 430a of the metal plate 430. In an embodiment, the peripheral area 422 of the circuit board 420 may be attached to the first surface 430a included in the second area 432 of the metal plate 430, for example. A conductive material may be disposed between the second area 432 of the metal plate 430 and the circuit board 420. In an embodiment, the circuit board 420 may be disposed (e.g., mounted) on the first surface 430a of the metal plate 430 using surface mount tech ("SMT").

In various embodiments, the image sensor 421 may be disposed (e.g., mounted) on the first surface 430a included in the first area 431 of the metal plate 430 using SMT. In an embodiment, a conductive material may be disposed between the metal plate 430 and the image sensor 421, for example.

Figure 8:
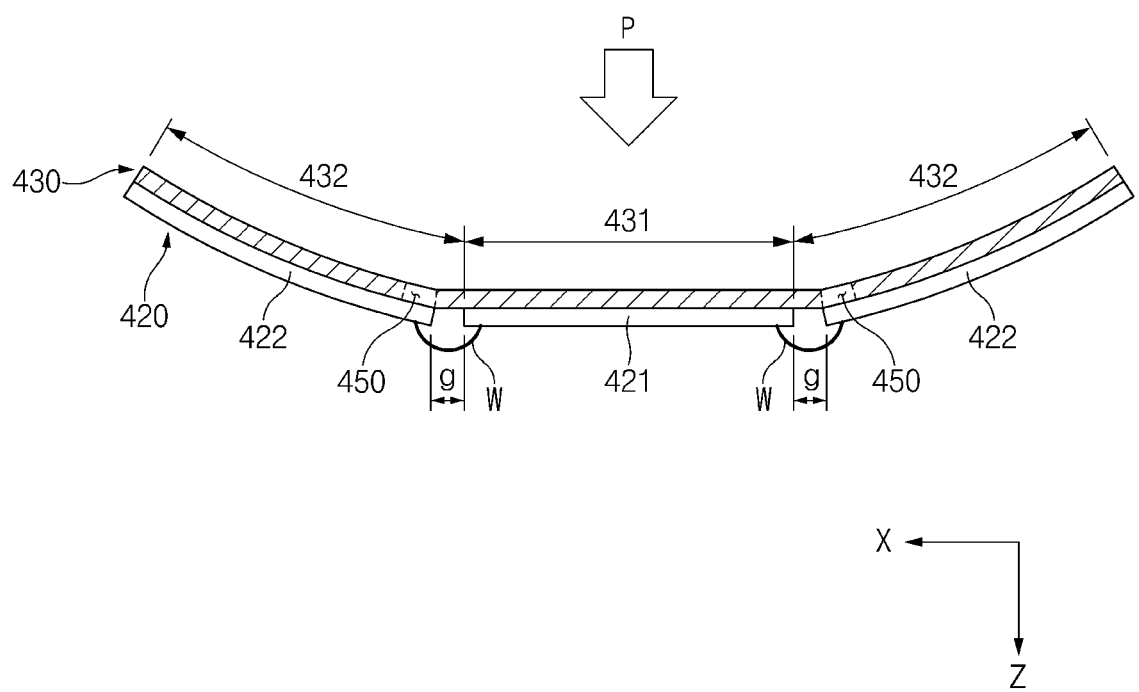
FIG. 8 is a cross-sectional view illustrating an embodiment of the circuit board and the metal plate of the camera module when an external force acts on the metal plate.

FIG. 8 is a cross-sectional view illustrating an embodiment of the circuit board and the metal plate of the camera module when an external force acts on the metal plate. FIG. 8 is a cross-sectional view taken along line B-B of FIG. 7.

Referring to FIG. 8, the metal plate 430 may include the first area 431 on which the image sensor 421 is disposed and the second area 432 around the first area 431. The peripheral area 422 of the circuit board 420 may be attached to a portion of the second area 432. The first area 431 may correspond to the opening area 423 of the circuit board 420. In an embodiment, when viewed in the direction of the optical axis OA (e.g., the z-axis direction), the metal plate 430 may be configured such that the first area 431 and the image sensor 421 are located in the opening area 423 of the circuit board 420 and at least a portion of the second area 432 overlaps the peripheral area 422 of the circuit board 420, for example.

Referring to FIG. 8, the one or more slits 450 may be defined in the second area 432 of the metal plate 430. Although not illustrated in the drawing, the one or more slits 450 may be replaced with a recess (e.g., the recess 470 of FIG. 14A) defined in the second surface 430b and recessed in the +z-axis direction.

In an embodiment, the one or more slits 450 or the recess may be defined in the metal plate 430 and may be located in the outward direction of the image sensor 421. In an embodiment, the outward direction of the image sensor 421 may be defined as a direction away from the point through which the optical axis OA passes, in a direction perpendicular to the optical axis OA (e.g., the x-axis or the y-axis), for example.

In an embodiment, the one or more slits 450 or the recess may overlap the peripheral area 422 of the circuit board 420 when viewed in the direction of the optical axis OA (e.g., the z-axis). In an embodiment, when the metal plate 430 forms the camera housing 401, infiltration of foreign matter into the camera housing 401 through the slits 450 may be prevented, for example.

In an embodiment, the image sensor 421 may be disposed on the first area 431 of the metal plate 430 and may be electrically connected with the circuit board 420, which is disposed on the second area 432 of the metal plate 430, through wire bonding. In an embodiment, the circuit board 420 may include wires W extending from the image sensor 421 to the peripheral area 422 of the circuit board 420, for example. The wires W may extend to partially cross the one or more slits 450 or the recess when viewed in the direction of the optical axis OA (e.g., the z-axis).

In an embodiment, the first area 431 of the metal plate 430 may remain substantially flat even when the external force P acts. In an embodiment, the second area 432 of the metal plate 430 and/or the peripheral area 422 of the circuit board 420 may be deformed to be flat or curved. In an embodiment, when the external force P acts, the second area 432 of the metal plate 430 may be at least partially deformed to be curved, for example. In an embodiment, the one or more slits 450 or the recess defined in the second area 432 may be defined in the metal plate 430, and the metal plate 430 may be configured such that the second area 432 corresponding to the peripheral area 422 around the image sensor 421 is bent prior to the first area 431 on which the image sensor 421 is disposed, for example. In an embodiment, the boundary line between the curved area and the flat area of the metal plate 430 may be formed adjacent to the one or more slits 450 or the recess, for example. In an embodiment, when the one or more slits 450 or the recess is not defined in the metal plate 430, the image sensor 421 or the first area 431 may be bent by the external force P or the bending stress caused by the external force P, which may lead to damage to the image sensor 421 or deterioration in the performance of the image sensor 421, for example.

Figure 9:
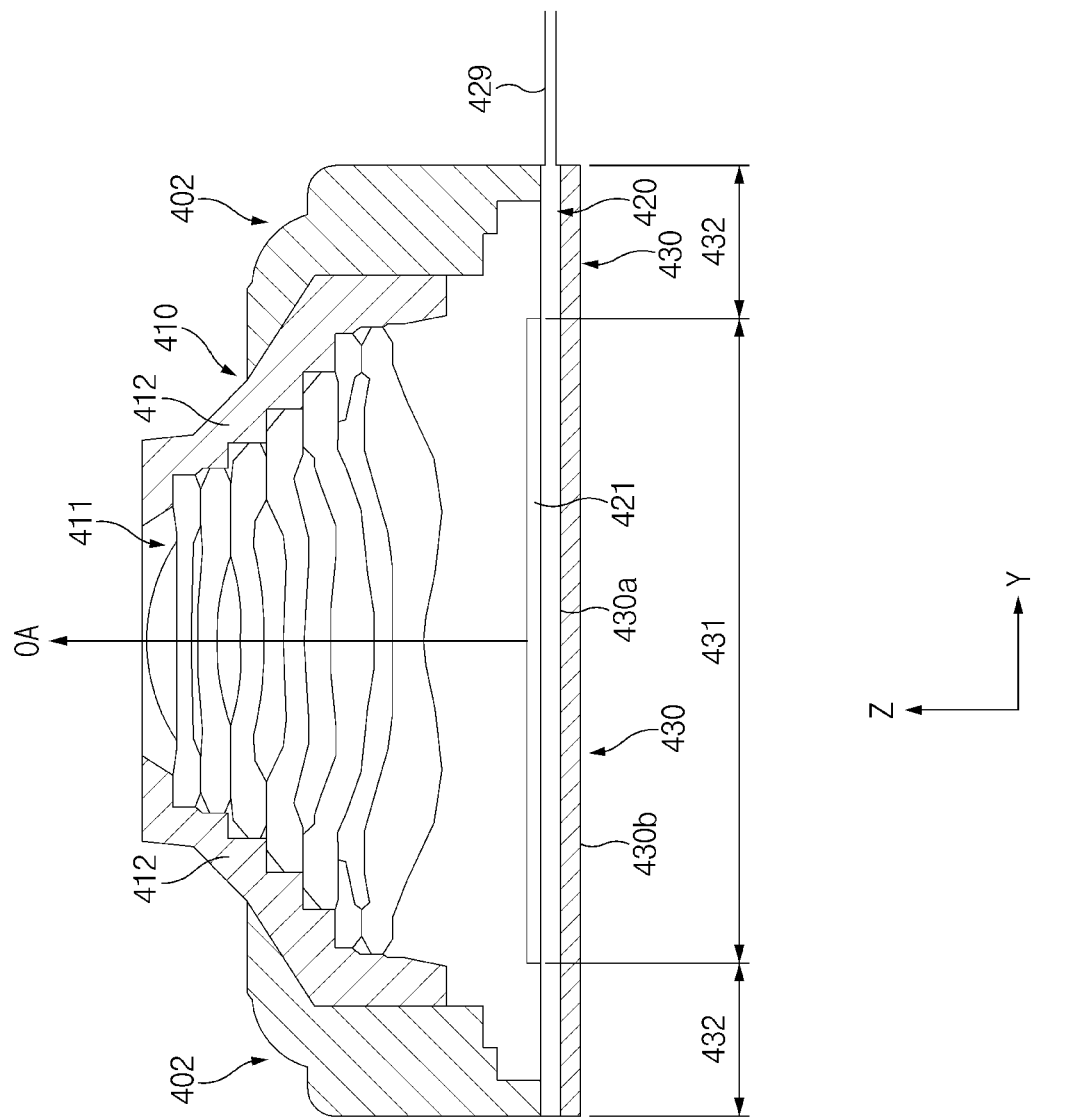
FIG. 9 is a cross-sectional view of an embodiment of a camera module.
Figure 10:
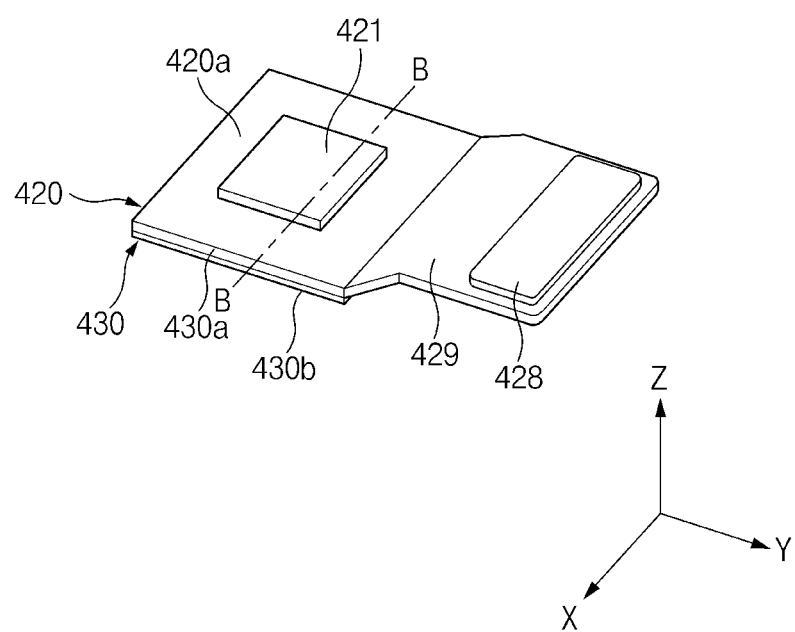
FIG. 10 is a view illustrating an embodiment of a circuit board and a metal plate of the camera module.
Figure 11:
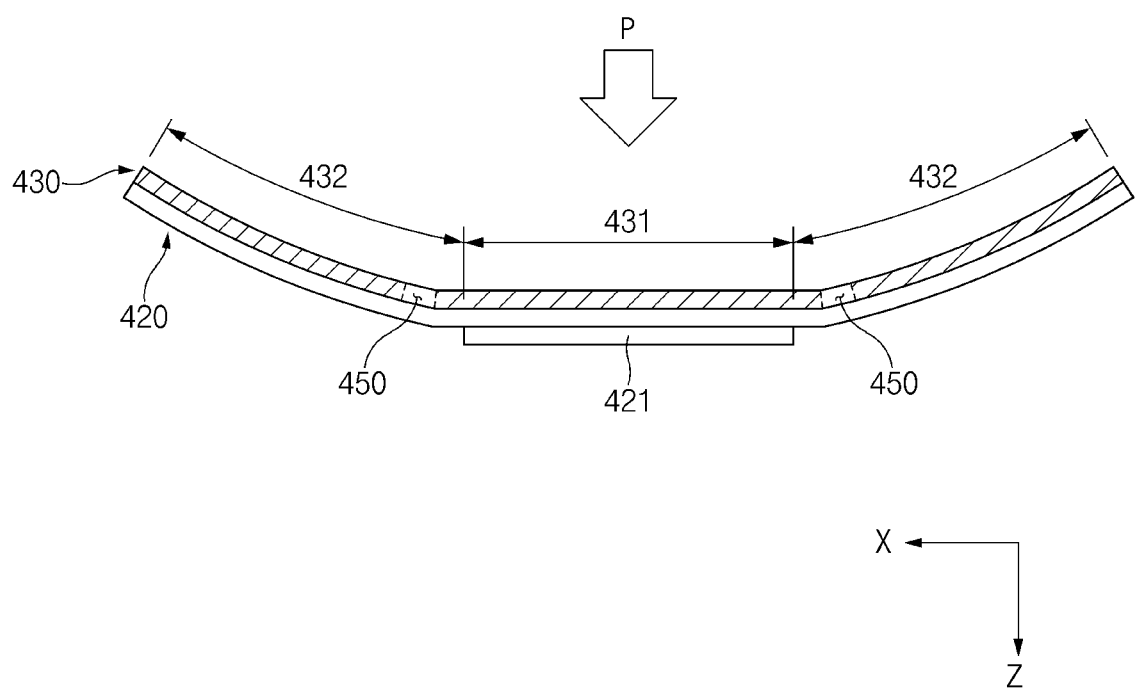
FIG. 11 is a cross-sectional view illustrating an embodiment of the circuit board and the metal plate of the camera module when an external force acts on the metal plate.

FIG. 9 is a cross-sectional view of an embodiment of a camera module. FIG. 10 is a view illustrating an embodiment of a circuit board and a metal plate of the camera module. FIG. 11 is a cross-sectional view illustrating an embodiment of the circuit board and the metal plate of the camera module when an external force acts on the metal plate.

FIG. 9 is a cross-sectional view taken along line A-A of FIG. 4. FIG. 11 is a cross-sectional view taken along line B-B of FIG. 10. In describing FIGS. 9, 10, and 11, repetitive descriptions identical to ones given with regard to the embodiment illustrated in FIGS. 6, 7, and 8 will be omitted.

Referring to FIGS. 9 and 10, in an embodiment, the circuit board may be disposed on a first surface 430a of the metal plate 430. In an embodiment, a second surface 430b of the metal plate 430 may form the lower surface of the camera module 400 (e.g., the lower surface 401c of FIG. 4). In an embodiment, the metal plate 430 may include a first area 431 corresponding to an image sensor 421 and a second area 432 surrounding the first area 431. In an embodiment, the first area 431 may be defined as an area overlapping the area on which the image sensor 421 is disposed (e.g., mounted), when the metal plate 430 is viewed in the direction of an optical axis OA (e.g., the z-axis), for example. The second area 432 may be defined as the remaining area other than the first area 431. In an embodiment, the second area 432 may be defined as an area around the first area 431, for example.

In an embodiment, the circuit board 420 may be disposed on the first surface 430a of the metal plate 430. The image sensor 421 may be disposed on the circuit board 420. In an embodiment, the image sensor 421 may be disposed (e.g., mounted) on a third surface 420a of the circuit board 420 using SMT.

Referring to the camera module 400 illustrated in FIGS. 9, 10, and 11, unlike in FIGS. 6, 7, and 8, the opening area 423 may not be defined in the circuit board 420, and the image sensor 421 may be attached to the circuit board 420 rather than the metal plate 430. In an embodiment, the circuit board 420 may be disposed between the image sensor 421 and the first area 431 of the metal plate 430, for example.

Referring to FIG. 11, one or more slits 450 may be defined in the second area 432 of the metal plate 430. Although not illustrated in the drawing, the one or more slits 450 may be replaced with a recess (e.g., the recess 470 of FIG. 14A) defined in the second surface 430b of the second area 432 of the metal plate 430 and recessed in the +z-axis direction.

In an embodiment, the one or more slits 450 or the recess may be defined in the metal plate 430 and may be located in the outward direction of the image sensor 421. In an embodiment, the outward direction of the image sensor 421 may be defined as a direction away from the point through which the optical axis OA passes, in a direction perpendicular to the optical axis OA (e.g., the x-axis or the y-axis), for example.

In an embodiment, the one or more slits 450 or the recess may overlap the circuit board 420 when viewed in the direction of the optical axis OA (e.g., the z-axis). In an embodiment, when the metal plate 430 forms a camera housing 401, infiltration of foreign matter into the camera housing 401 through the slits 450 may be prevented, for example.

In an embodiment, the first area 431 of the metal plate 430 may remain substantially flat even when an external force P acts. In an embodiment, the second area 432 of the metal plate 430 and/or a portion of the circuit board 420 around the image sensor 421 may be deformed to be flat or curved. In an embodiment, when the external force acts, the second area 432 of the metal plate 430 may be deformed to be curved, for example. In an embodiment, the one or more slits 450 or the recess defined in the second area 432 may be defined in the metal plate 430, and the metal plate 430 may be configured such that the second area 432 is bent prior to the first area 431 corresponding to the image sensor 421, for example. In an embodiment, the boundary line between the curved area and the flat area of the metal plate 430 may be formed adjacent to the one or more slits 450 or the recess, for example. In an embodiment, when the one or more slits 450 or the recess is not defined in the metal plate 430, the image sensor 421 or the first area 431 may be bent by the external force P or the bending stress caused by the external force P, which may lead to damage to the image sensor 421 or deterioration in the performance of the image sensor 421, for example.

Hereinafter, various forms of the slits 450 (or, the recess) of the camera module 400 will be described with reference to FIGS. 12A, 12B, 13A, 13B, 14A, and 14B.

Figure 12A:
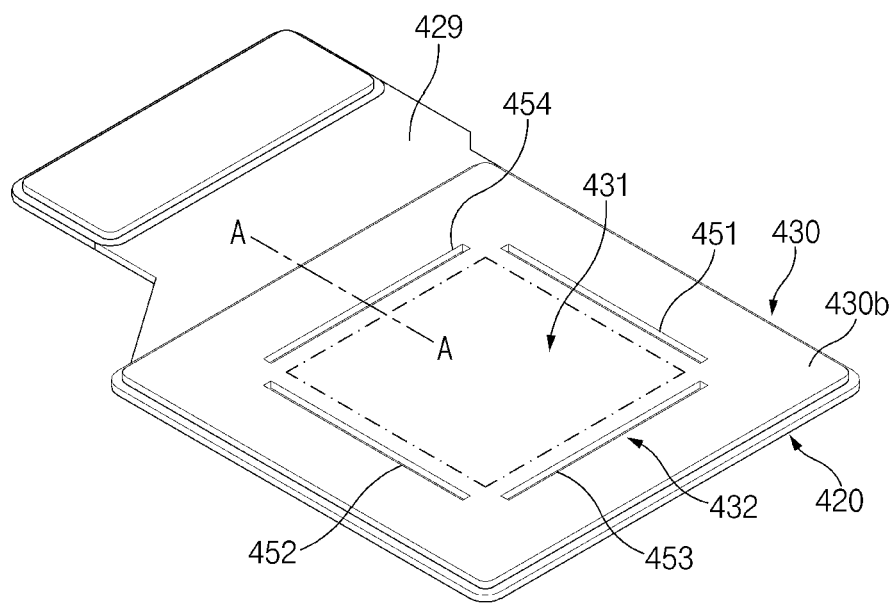
FIGS. 12A and 12B are views illustrating an embodiment of a metal plate and a circuit board of a camera module.
Figure 12B:
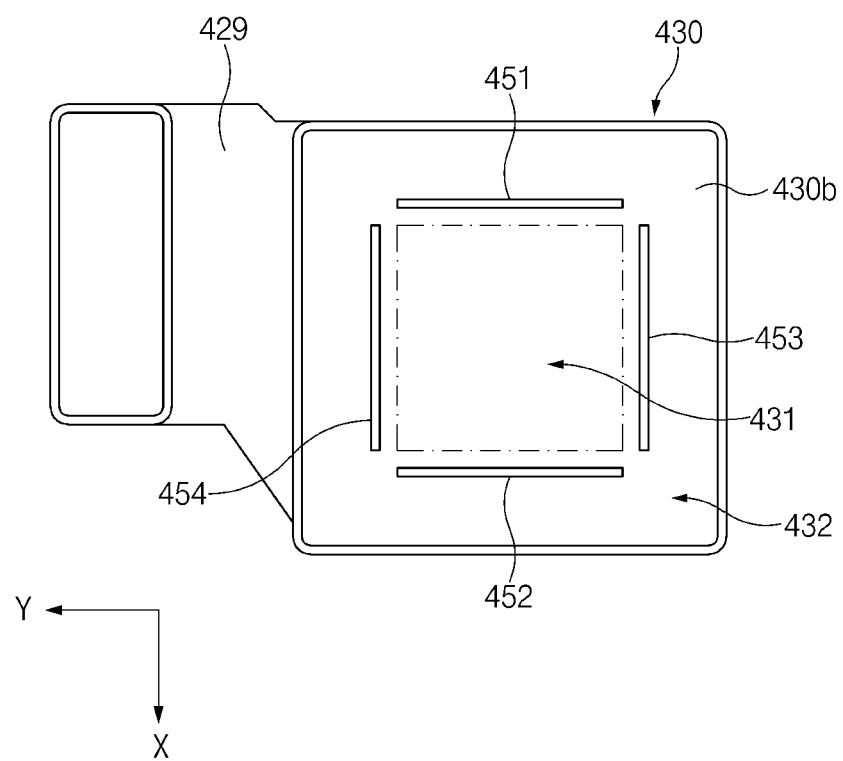

FIGS. 12A and 12B are views illustrating an embodiment of a metal plate and a circuit board of a camera module. FIG. 12B is a plan view of a second surface of the metal plate as viewed from above.

The circuit board 420 illustrated in FIGS. 12A and 12B may include the circuit board illustrated in FIGS. 6, 7, and 8 in which the opening area 423 is defined or the circuit board illustrated in FIGS. 9, 10, and 11 in which the opening area 423 is not defined.

In an embodiment, a first area 431 of the metal plate 430 illustrated by a dotted line may be defined as an area in physical contact with an image sensor 421 as illustrated in FIGS. 6, 7, and 8 or an area overlapping the image sensor 421 in physical contact with the circuit board 420 as illustrated in FIGS. 9, 10, and 11, for example.

In an embodiment, slits 450 may be defined in a second area 432 of the metal plate 430. The slits 450 may penetrate the second area 432 of the metal plate 430. In an embodiment, the slits 450 may be provided in the form of an opening that penetrates the second surface 430b from the first surface 430a of the metal plate 430, for example. In an embodiment, when the second surface 430b of the metal plate 430 is viewed from above (e.g., when viewed in the z-axis direction), the circuit board 420 may be visible through the slits 450, for example.

In an embodiment, the slits 450 may extend in a direction (e.g., the x-axis or the y-axis) perpendicular to an optical axis (e.g., the z-axis). In an embodiment, each of the slits 450 may extend at least partially parallel to one of the edges of the first area 431 or one of the edges of the image sensor 421. In an embodiment, the slits 450 may include a first slit 451 and a second slit 452 that extend in the y-axis direction and a third slit 453 and a fourth slit 454 that extend in the x-axis direction.

In an embodiment, the first slit 451 and the second slit 452 may face each other in the x-axis direction. The first area 431 or the image sensor 421 may be located between the first slit 451 and the second slit 452. Each of the first slit 451 and the second slit 452 may be defined in a position spaced apart from an edge of the first area 431 by a predetermined gap in the x-axis direction. In an embodiment, as illustrated in FIG. 8, the first slit 451 and the second slit 452 may be defined in positions spaced apart from the opening area 423 of the circuit board 420 so as not to overlap the opening area 423 of the circuit board 420, for example. In an embodiment, the first slit 451 and the second slit 452 may be provided such that a region of the second area 432 of the metal plate 430 located in the x-axis direction with respect to the first area 431 and a region of the second area 432 of the metal plate 430 located in the −x-axis direction with respect to the first area 431 are bent when an external force is applied to the metal plate 430.

In an embodiment, the third slit 453 and the fourth slit 454 may face each other in the y-axis direction. The first area 431 or the image sensor 421 may be located between the third slit 453 and the fourth slit 454. Each of the third slit 453 and the fourth slit 454 may be defined in a position spaced apart from an edge of the first area 431 by a predetermined gap in the y-axis direction. In an embodiment, as illustrated in FIG. 8, the third slit 453 and the fourth slit 454 may be defined in positions spaced apart from the opening area 423 of the circuit board 420 so as not to overlap the opening area 423 of the circuit board 420, for example. In an embodiment, the third slit 453 and the fourth slit 454 may be provided such that a region of the second area 432 of the metal plate 430 located in the y-axis direction with respect to the first area 431 and a region of the second area 432 of the metal plate 430 located in the −y-axis direction with respect to the first area 431 are bent when an external force is applied to the metal plate 430.

In various embodiments (not illustrated), at least one of the first slit 451, the second slit 452, the third slit 453, or the fourth slit 454 may be replaced with a recess 470 concavely defined in the second surface 430b included in the second area 432 of the metal plate 430.

In various embodiments, at least one of the first slit 451, the second slit 452, the third slit 453, or the fourth slit 454 may extend to have a length (also referred to as an extension length) less than a length of an edge of the first area 431 adjacent thereto or an edge of the image sensor 421 adjacent thereto.

Figure 13A:
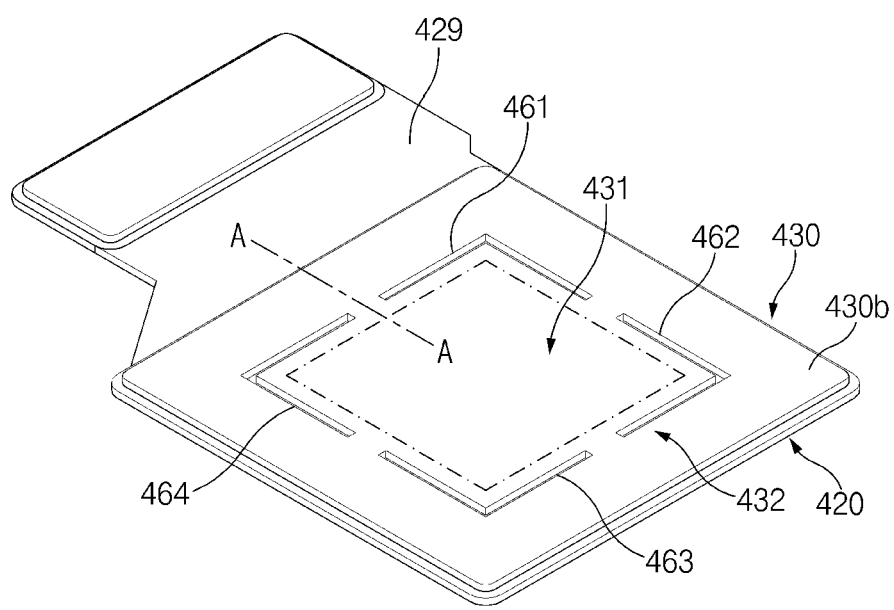
FIGS. 13A and 13B are views illustrating an embodiment of a metal plate and a circuit board of a camera module.
Figure 13B:
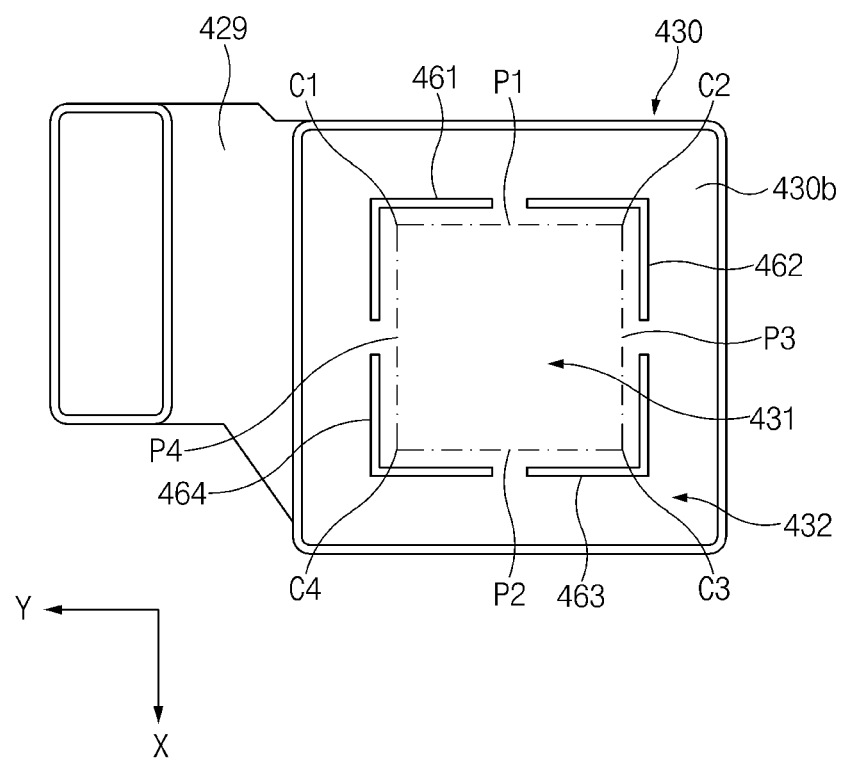

FIGS. 13A and 13B are views illustrating an embodiment of a metal plate and a circuit board of a camera module. FIG. 13B is a plan view of a second surface of the metal plate as viewed from above.

The circuit board 420 illustrated in FIGS. 13A and 13B may include the circuit board illustrated in FIGS. 6, 7, and 8 in which the opening area 423 is defined or the circuit board illustrated in FIGS. 9, 10, and 11 in which the opening area 423 is not defined.

In an embodiment, a first area 431 of the metal plate 430 illustrated by a dotted line may be defined as an area in physical contact with an image sensor 421 as illustrated in FIGS. 6, 7, and 8 or an area overlapping the image sensor 421 in physical contact with the circuit board 420 as illustrated in FIGS. 9, 10, and 11, for example.

In an embodiment, slits 460 may be defined in a second area 432 of the metal plate. The slits 460 may penetrate the second area 432 of the metal plate 430. In an embodiment, the slits 460 may be provided in the form of an opening that penetrates the second surface 430b from the first surface 430a of the metal plate 430, for example. In an embodiment, when the second surface 430b of the metal plate 430 is viewed from above, the circuit board 420 may be visible through the slits 460, for example.

In an embodiment, the slits 460 may surround corner areas C1, C2, C3, and C4 of the first area 431 or the image sensor 421, respectively. Each of the corner areas C1, C2, C3, and C4 may be defined as an area where edges extending in different directions meet each other. In various embodiments, a first edge P1 and a second edge P2 parallel to each other in the y-axis direction and a third edge P3 and a fourth edge P4 parallel to each other in the x-axis direction may be defined in the first area 431.

In an embodiment, each of a first slit 461, a second slit 462, a third slit 463, and a fourth slit 464 may be spaced apart from a slit adjacent thereto in the x-axis and/or y-axis direction. In an embodiment, the first slit 461 may face the third slit 463 in a diagonal direction, and the second slit 462 may face the fourth slit 464 in a diagonal direction.

In an embodiment, the first slit 461, the second slit 462, the third slit 463, and the fourth slit 464 may be defined in positions spaced apart from the corner areas C1, C2, C3, and C4 of the first area 431, respectively. In an embodiment, as illustrated in FIG. 8, each of the first slit 461, the second slit 462, the third slit 463, and the fourth slit 464 may be provided so as not to overlap the opening area 423 of the circuit board 420, for example.

In an embodiment, the first slit 461 may be provided adjacent to the first corner area C1 of the first area 431. The first corner area C1 may include the area where the first edge P1 and the fourth edge P4 meet each other. The first slit 461 may include a portion extending at least partially parallel to the first edge P1 and a portion extending at least partially parallel to the fourth edge P4. In an embodiment, one portion of the first slit 461 may extend in the y-axis direction, and the other portion of the first slit 461 may extend in the x-axis direction, for example.

In an embodiment, the second slit 462 may be provided adjacent to the second corner area C2 of the first area 431. The second corner area C2 may include the area where the first edge P1 and the third edge P3 meet each other. The second slit 462 may include a portion extending at least partially parallel to the first edge P1 and a portion extending at least partially parallel to the third edge P3. In an embodiment, one portion of the second slit 462 may extend in the y-axis direction, and the other portion of the second slit 462 may extend in the x-axis direction, for example.

In an embodiment, the third slit 463 may be provided adjacent to the third corner area C3 of the first area 431. The third corner area C3 may include the area where the third edge P3 and the second edge P2 meet each other. The third slit 463 may include a portion extending at least partially parallel to the third edge P3 and a portion extending at least partially parallel to the second edge P2. In an embodiment, one portion of the third slit 463 may extend in the y-axis direction, and the other portion of the third slit 463 may extend in the x-axis direction, for example.

In an embodiment, the fourth slit 464 may be provided adjacent to the fourth corner area C4 of the first area 431. The fourth corner area C4 may include the area where the second edge P2 and the fourth edge P4 meet each other. The fourth slit 464 may include a portion extending at least partially parallel to the second edge P2 and a portion extending at least partially parallel to the fourth edge P4. In an embodiment, one portion of the fourth slit 464 may extend in the y-axis direction, and the other portion of the fourth slit 464 may extend in the x-axis direction, for example.

In various embodiments (not illustrated), at least one of the first slit 461, the second slit 462, the third slit 463, or the fourth slit 464 may be replaced with a recess (e.g., the recess 470 of FIG. 14A) concavely defined in the second surface 430b included in the second area 432 of the metal plate 430.

Figure 14A:
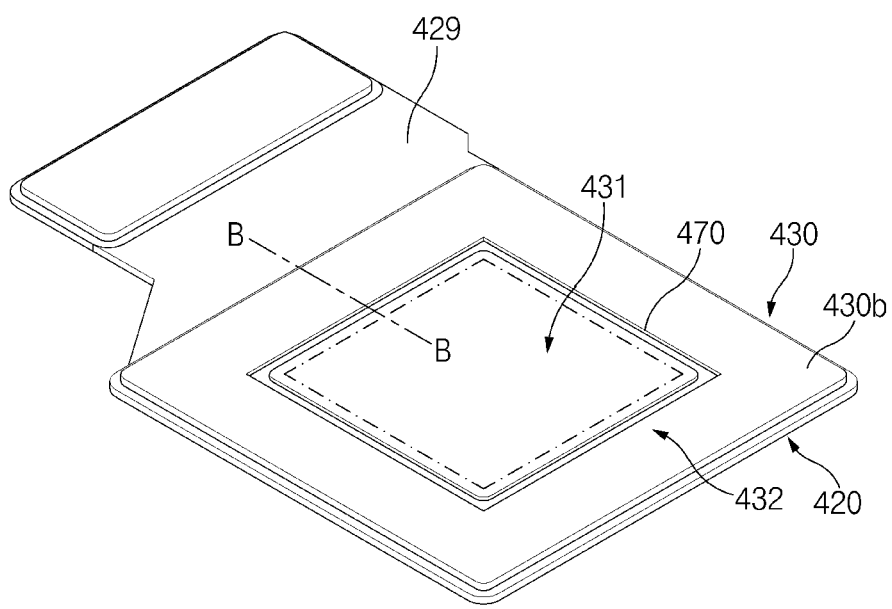
FIGS. 14A and 14B are views illustrating an embodiment of a metal plate and a circuit board of a camera module.
Figure 14B:
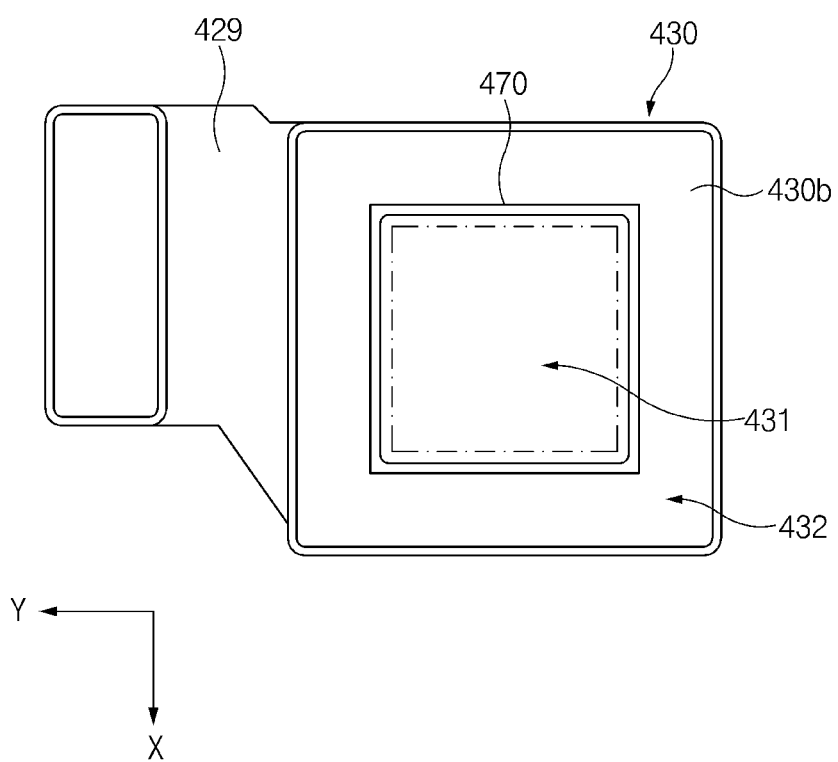

FIGS. 14A and 14B are views illustrating an embodiment of a metal plate and a circuit board of a camera module. FIG. 14B is a plan view of a second surface of the metal plate as viewed from above.

The circuit board 420 illustrated in FIGS. 14A and 14B may include the circuit board illustrated in FIGS. 6, 7, and 8 in which the opening area 423 is defined or the circuit board illustrated in FIGS. 9, 10, and 11 in which the opening area 423 is not defined.

In an embodiment, a first area 431 of the metal plate 430 illustrated by a dotted line may be defined as an area in physical contact with an image sensor 421 as illustrated in FIGS. 6, 7, and 8 or an area overlapping the image sensor 421 physically disposed (e.g., mounted) on the circuit board 420 as illustrated in FIGS. 9, 10, and 11, for example.

In an embodiment, a recess 470 that is defined in a second area 432 and that surrounds the first area 431 may be defined in the metal plate 430. In an embodiment, the recess 470 may be defined in the second surface 430b included in the second area 432 of the metal plate 430, for example. The recess 470 may include an area recessed toward the first surface 430a (e.g., the +z-axis direction). In an embodiment, the recess 470 may be recessed by a thickness smaller than the thickness of the metal plate 430 without penetrating the metal plate 430, for example. In an embodiment, the recess 470 may be provided in a form parallel to the edges of the first area 431. The recess 470 may be defined in a position spaced apart from the first area 431 by a predetermined gap.

The table below shows bending stresses applied to image sensors 421 in comparative examples and embodiments when the same external force (e.g., the external force P of FIG. 5) is applied to metal plates 430. Comparative examples 1 and 2 include metal plates in which the slits 450 or 460 or the recess 479 is not defined. Embodiment 1 includes the metal plate illustrated in FIGS. 12A and 12B. Embodiment 2 includes the metal plate illustrated in FIGS. 13A and 13B. Embodiment 3 includes the metal plate illustrated in FIGS. 14A and 14B.

Referring to [Table 1] below, the camera modules 400 in the embodiments of the disclosure may include the metal plates 430 having a relatively small thickness and thus may have an effect of decreasing the overall thicknesses of the camera modules 400.

In addition, the slits 450 or 460 or the recess 470 defined outside the image sensors 421 may be defined in the metal plates 430, and thus may have an effect of protecting the image sensors 421 by reducing bending stresses applied to the image sensors 421. In an embodiment, embodiment 3 may have substantially the same level of protection effect as comparative example 2 including a relatively thick metal plate, for example. In an embodiment, embodiments 1 and 2 may have a relatively improved effect, compared to comparative example 2 including a relatively thick metal plate, for example.

TABLE 1

| | Thickness of Metal Plate | Bending Stress Applied to Image Sensor |
|---|---|---|
| Comparative Example 1 | 0.15T | 40 Mpa |
| Comparative Example 2 | 0.25T | 32 Mpa |
| Embodiment 1 | 0.15T | 16 Mpa |
| Embodiment 2 | 0.15T | 18 Mpa |
| Embodiment 3 | 0.15T | 33 Mpa |

Figure 15A:
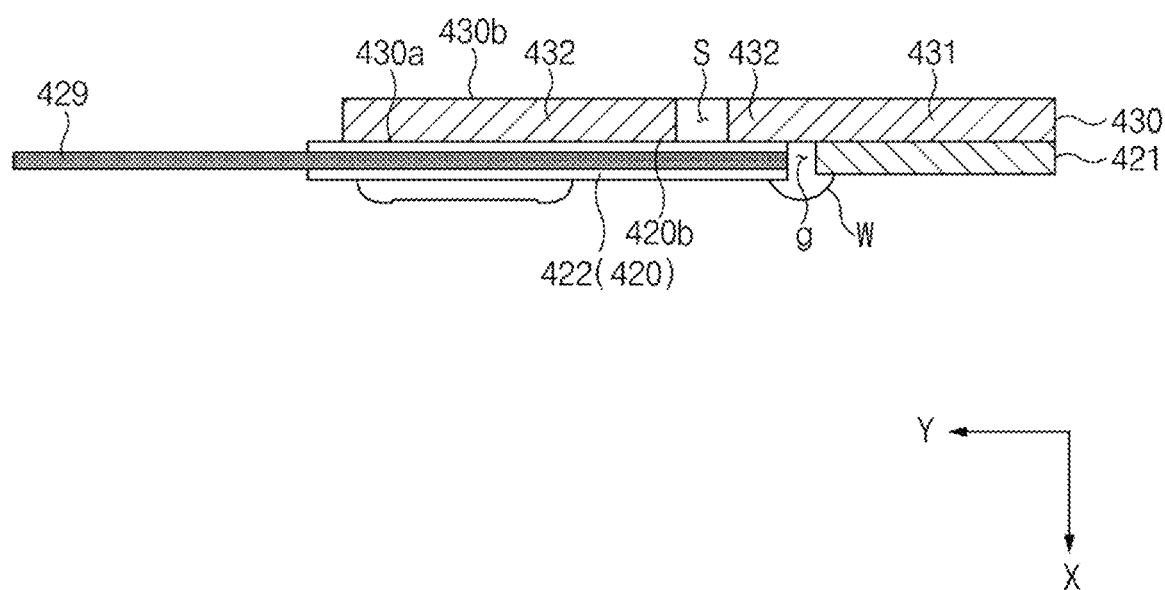
FIGS. 15A and 15B are cross-sectional views illustrating an embodiment of a metal plate and a circuit board of a camera module.
Figure 15B:
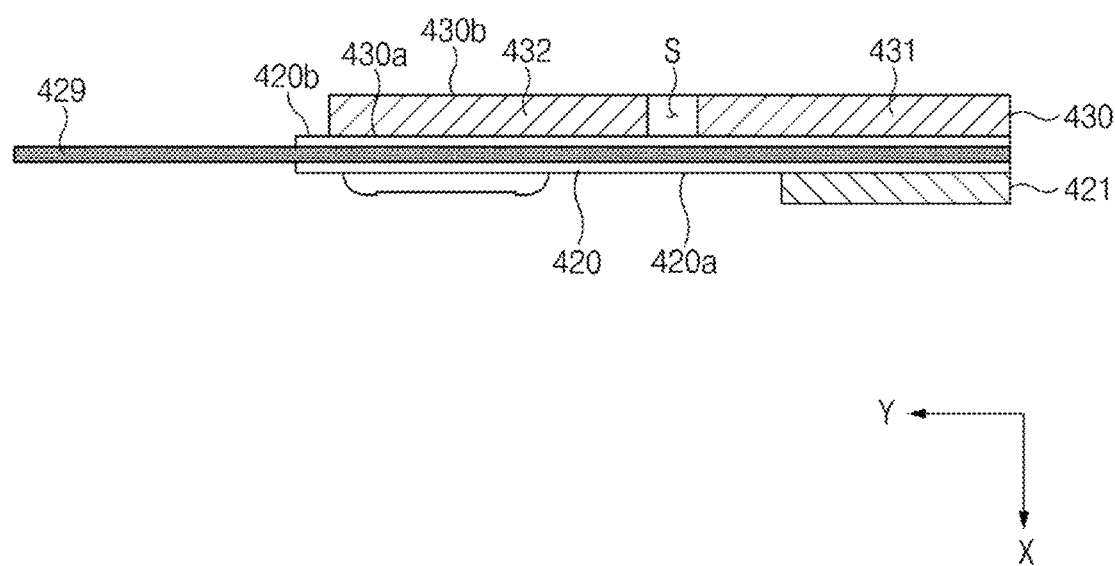

FIGS. 15A and 15B are cross-sectional views illustrating a metal plate and a circuit board of a camera module. In an embodiment, FIGS. 15A and 15B are cross-sectional views taken along line A-A of FIG. 12A or FIG. 13A, for example.

A slit S illustrated in FIGS. 15A and 15B may include at least one of the slits 450 illustrated in FIGS. 12A and 12B and/or at least one of the slits 460 illustrated in FIGS. 13A and 13B.

Referring to FIGS. 15A and 15B, the slit S may be located in the outward direction of an image sensor 421. In an embodiment, the slit S may be located in a second area 432 of the metal plate 430, for example. The slit S may pass through a first surface 430a from a second surface 430b included in the second area 432. In an embodiment, when the second surface 430b of the metal plate 430 is viewed in the direction of an optical axis OA (e.g., the z-axis direction), a portion of the circuit board 420 may be visible through the slit S, for example. In an embodiment, the slit S may overlap the circuit board 420 when viewed in the direction of the optical axis OA (e.g., the z-axis direction).

Referring to FIG. 15A, a fourth surface 420b included in a peripheral area 422 of the circuit board 420 may at least partially contact the first surface 430a included in the second area 432 of the metal plate 430. The image sensor 421 may be attached to a first area 431 of the metal plate 430. The circuit board 420 and the image sensor 421 may be connected through wires W. The wires W may extend from the peripheral area 422 of the circuit board 420 to the image sensor 421 across a gap g between the peripheral area 422 of the circuit board 420 and the image sensor 421. The slit S may not overlap the gap g or the wires W when viewed in the direction of the optical axis OA. The slit S may overlap the peripheral area 422 of the circuit board 420 when viewed in the direction of the optical axis OA. Accordingly, infiltration of foreign matter into the camera module 400 through the slit S of the metal plate 430 may be prevented. In an embodiment, when the second surface 430b of the metal plate 430 is viewed from above, the peripheral area 422 of the circuit board 420 may be visible through the slit, for example.

Referring to FIG. 15B, the fourth surface 420b of the circuit board 420 may be attached to the first surface 430a of the metal plate 430. The image sensor 421 may be disposed (e.g., mounted) on a third surface 420a of the circuit board 420. A portion of the circuit board 420 may be disposed between the first area 431 of the metal plate 430 and the image sensor 421. The image sensor 421 may be disposed (e.g., mounted) on the circuit board 420 using SMT and may be electrically connected with the circuit board 420. The slit S may overlap a partial area of the circuit board 420 when viewed in the direction of the optical axis OA (e.g., the z-axis direction). The partial area may be a portion around the area on which the image sensor 421 is disposed (e.g., mounted). In an embodiment, when the second surface 430b of the metal plate 430 is viewed from above, the circuit board 420 may be visible through the slit S, for example.

Figure 16A:
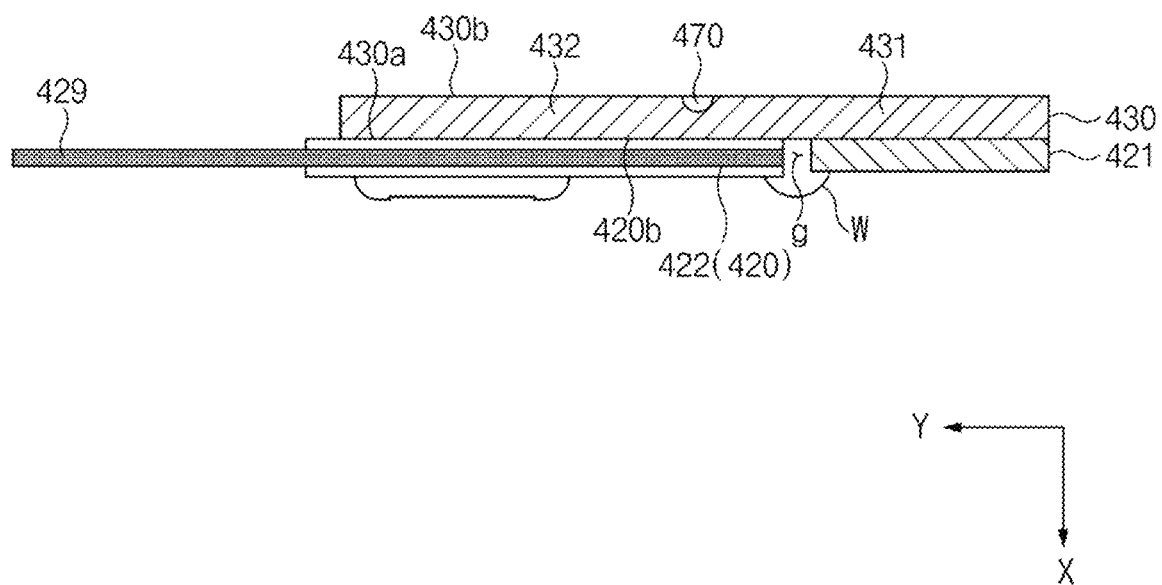
FIGS. 16A and 16B are cross-sectional views illustrating an embodiment of a metal plate and a circuit board of a camera module.
Figure 16B:
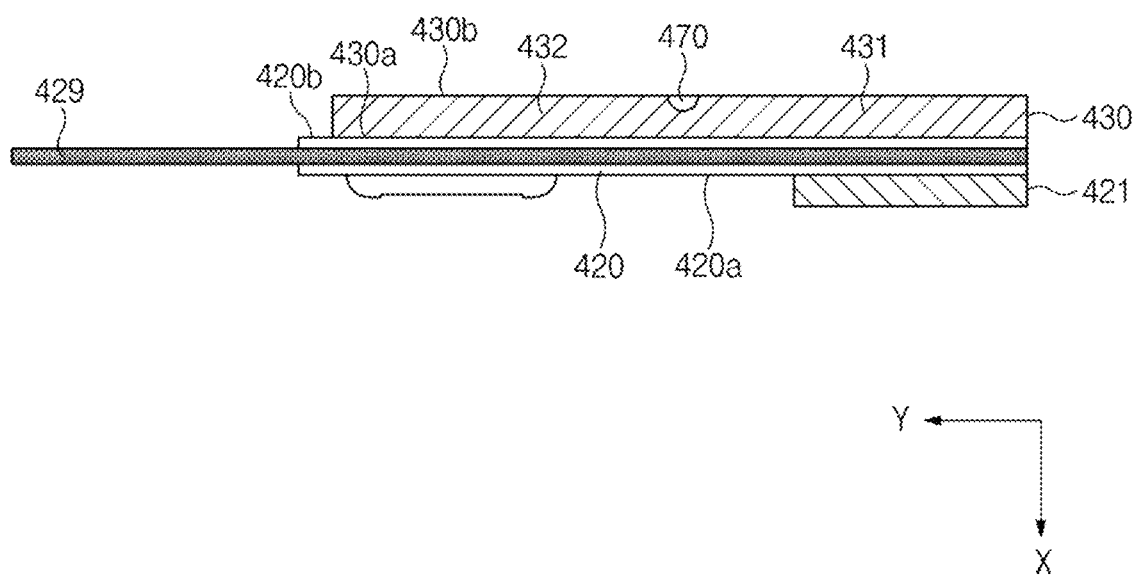

FIGS. 16A and 16B are cross-sectional views illustrating a metal plate and a circuit board of a camera module. In an embodiment, FIGS. 16A and 16B are cross-sectional views taken along line B-B of FIG. 14A, for example.

Referring to FIGS. 16A and 16B, a recess 470 may be located in the outward direction of an image sensor 421. In an embodiment, the recess 470 may be located in a second area 432 of the metal plate 430, for example. The recess 470 may be defined in a second surface 430b included in the second area 432 and may be recessed toward a first surface 430a. In an embodiment, the recess 470 may overlap the circuit board 420 when viewed in the direction of an optical axis OA (e.g., the z-axis direction).

Referring to FIG. 16A, a fourth surface 420b included in a peripheral area 422 of the circuit board 420 may at least partially contact the first surface 430a included in the second area 432 of the metal plate 430. The image sensor 421 may be attached to a first area 431 of the metal plate 430. The circuit board 420 and the image sensor 421 may be connected through wires W. The wires W may extend from the peripheral area 422 of the circuit board 420 to the image sensor 421 across a gap g between the peripheral area 422 of the circuit board 420 and the image sensor 421. The recess 470 may overlap the peripheral area 422 of the circuit board 420 when viewed in the direction of the optical axis OA (e.g., the z-axis direction). In an embodiment, the recess 470 may not overlap the gap g or the wires W when viewed in the direction of the optical axis OA. In another embodiment, the recess 470 may overlap the gap g or the wires W when viewed in the direction of the optical axis OA.

Referring to FIG. 16B, the fourth surface of the circuit board may be attached to the first surface of the metal plate. The image sensor 421 may be disposed (e.g., mounted) on a third surface 420a of the circuit board 420. A portion of the circuit board 420 may be disposed between the first area 431 of the metal plate 430 and the image sensor 421. The image sensor 421 may be disposed (e.g., mounted) on the circuit board 420 using SMT and may be electrically connected with the circuit board 420. The recess 470 may overlap a partial area of the circuit board 420 when viewed in the direction of the optical axis OA. The partial area may be a portion around the area on which the image sensor 421 is disposed (e.g., mounted).

An electronic device in an embodiment of the disclosure includes a housing and a camera module in the housing. The camera module includes a camera housing, a lens assembly disposed in the camera housing, an image sensor disposed in the camera housing and at least partially aligned with an optical axis of the lens, a metal plate including a first area that overlaps the image sensor when viewed in a direction of the optical axis and a second area around the first area, and a circuit board at least partially attached to the metal plate and electrically connected with the image sensor. A slit that penetrates the metal plate or a recess concavely defined in a surface of the metal plate is defined in the second area of the metal plate.

In an embodiment, the image sensor may contact the first area of the metal plate, and the circuit board may include an opening area in which the image sensor is disposed and a peripheral area that surrounds the opening area and that is attached to a portion of the second area of the metal plate.

In an embodiment, a portion of the first area may be located in the opening area when the metal plate is viewed in the direction of the optical axis.

In an embodiment, the slit or the recess may overlap the peripheral area of the circuit board when the metal plate is viewed in the direction of the optical axis.

In an embodiment, a predetermined gap may be defined between the image sensor and the peripheral area of the circuit board, and the slit or the recess may not overlap the predetermined gap when the metal plate is viewed in the direction of the optical axis.

In an embodiment, the camera module may further include a wire that electrically connects the circuit board and the image sensor, and the wire may extend across the predetermined gap.

In an embodiment, the slit or the recess may be defined in a position non-overlapping the wire when viewed in the direction of the optical axis.

In an embodiment, the image sensor may be disposed (e.g., mounted) on the circuit board, and a portion of the circuit board may be disposed between the first area of the metal plate and the image sensor.

In an embodiment, when viewed in the direction of the optical axis, the slit or the recess may overlap an area around an area on which the image sensor is disposed (e.g., mounted).

In an embodiment, the image sensor may be disposed on a first surface of the metal plate, the recess may be concavely defined in a second surface of the metal plate that is opposite to the first surface of the metal plate, and the slit may pass through the second surface from the first surface of the metal plate.

In an embodiment, the slit may be provided in plural, and a plurality of slits may include a first slit and a second slit that extend in a first direction perpendicular to the optical axis and a third slit and a fourth slit that extend in a second direction perpendicular to the optical axis and the first direction.

In an embodiment, the slit may be spaced apart from an edge of the first area and may extend in a direction parallel to the edge, and an extension length of the slit may be less than a length of the edge.

In an embodiment, adjacent slits of the plurality of slits may be spaced apart from each other.

In an embodiment, the slit may be provided in plural, and a plurality of slits may be adjacent to corner areas of the first area, respectively.

In an embodiment, each of the plurality of slits may include parts that extend parallel to portions of two edges of the first area connected at a right angle.

In an embodiment, the slit may be provided in plural, and a plurality of slits may partially surround the first area when the surface of the metal plate is viewed from above.

In an embodiment, the recess may surround an entirety of the first area when the surface of the metal plate is viewed from above.

In an embodiment, the electronic device may further include a processor, the camera module may further include a connecting member that extends outside the camera housing from the circuit board, and the connecting member may electrically connect the circuit board and the processor.

In an embodiment, the connecting member may be unitary with the circuit board.

In an embodiment, when an external force is applied to the metal plate, the first area may remain substantially flat, and the second area may be at least partially deformed to be flat or curved.

The electronic device in embodiments may be one of various types of electronic devices. The electronic devices may include a portable communication device (e.g., a smartphone), a computer device, a portable multimedia device, a portable medical device, a camera, a wearable device, or a home appliance, for example. In an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other feature (e.g., importance or order). It is to be understood that when an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, e.g., "logic," "logic block," "part," or "circuitry". A module may be a single integral component, or a minimum unit or part thereof, adapted to perform one or more functions. In an embodiment, the module may be implemented in a form of an application-specific integrated circuit ("ASIC"), for example.

Various embodiments as set forth herein may be implemented as software (e.g., the program 140) including one or more instructions that are stored in a storage medium (e.g., internal memory 136 or external memory 138 in FIG. 1) that is readable by a machine (e.g., the electronic device 101). In an embodiment, a processor (e.g., the processor 120) of the machine (e.g., the electronic device 101) may invoke at least one of the one or more instructions stored in the storage medium, and execute it, with or without using one or more other components under the control of the processor, for example. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

In an embodiment, a method in embodiments of the disclosure may be included and provided in a computer program product. The computer program product may be traded as a product between a seller and a buyer. The computer program product may be distributed in the form of a machine-readable storage medium (e.g., compact disc read only memory ("CD-ROM")), or be distributed (e.g., downloaded or uploaded) online via an application store (e.g., PlayStore™), or between two user devices (e.g., smart phones) directly. When distributed online, at least a part of the computer program product may be temporarily generated or at least temporarily stored in the machine-readable storage medium, such as a memory of the manufacturer's server, a server of the application store, or a relay server.

In embodiments, each component (e.g., a module or a program) of the above-described components may include a single entity or multiple entities, and some of the multiple entities may be separately disposed in different components. In embodiments, one or more of the above-described components may be omitted, or one or more other components may be added. Alternatively or additionally, a plurality of components (e.g., modules or programs) may be integrated into a single component. In such a case, in embodiments, the integrated component may still perform one or more functions of each of the plurality of components in the same or similar manner as they are performed by a corresponding one of the plurality of components before the integration. In embodiments, operations performed by the module, the program, or another component may be carried out sequentially, in parallel, repeatedly, or heuristically, or one or more of the operations may be executed in a different order or omitted, or one or more other operations may be added.

The invention claimed is:

1. An electronic device comprising:
   a housing; and
   a camera module in the housing, the camera module comprising:
   a camera housing;
   a lens assembly including a lens and disposed in the camera housing;
   an image sensor disposed in the camera housing and at least partially aligned with an optical axis of the lens;
   a circuit board electrically connected with the image sensor and including an opening in which the image sensor is disposed and a peripheral area surrounding the opening and the image sensor;
   a metal plate including a first area which overlaps the image sensor when viewed in a direction of the optical axis and a second area around the first area; and
   wherein the peripheral area of the circuit board is at least partially attached to the metal plate, and wherein a slit which penetrates the metal plate or a recess concavely defined in a surface of the metal plate is defined in the second area of the metal plate.

2. The electronic device of claim 1, wherein the image sensor contacts the first area of the metal plate.

3. The electronic device of claim 1, wherein a portion of the first area is located in the opening when the metal plate is viewed in the direction of the optical axis.

4. The electronic device of claim 1, wherein the slit or the recess overlaps the peripheral area of the circuit board when the metal plate is viewed in the direction of the optical axis.

5. The electronic device of claim 1, wherein a predetermined gap is defined between the image sensor and the peripheral area of the circuit board, and
wherein the slit or the recess does not overlap the predetermined gap when the metal plate is viewed in the direction of the optical axis.

6. The electronic device of claim 5, wherein the camera module further includes a wire which electrically connects the circuit board and the image sensor, and
wherein the wire extends across the predetermined gap.

7. The electronic device of claim 6, wherein the slit or the recess is defined in a position non-overlapping the wire when viewed in the direction of the optical axis.

8. The electronic device of claim 1, wherein when viewed in the direction of the optical axis, the slit or the recess overlaps the peripheral area.

9. The electronic device of claim 1, wherein the image sensor is disposed on a first surface of the metal plate,
wherein the recess is concavely defined in a second surface of the metal plate which is opposite to the first surface of the metal plate, and
wherein the slit passes through the second surface from the first surface of the metal plate.

10. The electronic device of claim 1, wherein the slit is provided in plural, and
wherein a plurality of slits includes a first slit and a second slit which extend in a first direction perpendicular to the optical axis and a third slit and a fourth slit which extend in a second direction perpendicular to the optical axis and the first direction.

11. The electronic device of claim 1, wherein the slit is spaced apart from an edge of the first area and extends in a direction parallel to the edge, and
wherein an extension length of the slit is less than a length of the edge.

12. The electronic device of claim 10, wherein adjacent slits of the plurality of slits are spaced apart from each other.

13. The electronic device of claim 1, wherein the slit is provided in plural, and a plurality of slits is adjacent to corner areas of the first area, respectively.

14. The electronic device of claim 13, wherein each of the plurality of slits includes parts which extend parallel to portions of two edges of the first area connected at a right angle.

15. The electronic device of claim 1, wherein the slit is provided in plural, and a plurality of slits partially surrounds the first area when the surface of the metal plate is viewed from above.

16. The electronic device of claim 1, wherein the recess surrounds an entirety of the first area when the surface of the metal plate is viewed from above.

17. The electronic device of claim 1, further comprising a processor,
wherein the camera module further includes a connecting member which extends outside the camera housing from the circuit board, and
wherein the connecting member electrically connects the circuit board and the processor.

18. The electronic device of claim 17, wherein the connecting member is unitary with the circuit board.

19. The electronic device of claim 1, wherein when an external force is applied to the metal plate, the first area remains substantially flat, and the second area is at least partially deformed to be flat or curved.

* * * * *